US012695270B2

(12) United States Patent
Iguchi et al.

(10) Patent No.: US 12,695,270 B2
(45) Date of Patent: Jul. 28, 2026

(54) LIGHT-EMITTING ARRAY, LIGHT-EMITTING DEVICE, MEASUREMENT APPARATUS, AND METHOD FOR MANUFACTURING LIGHT-EMITTING ARRAY

(71) Applicant: FUJIFILM Business Innovation Corp., Tokyo (JP)

(72) Inventors: Daisuke Iguchi, Kanagawa (JP); Kei Takeyama, Kanagawa (JP); Seiji Ono, Kanagawa (JP); Tomoaki Sakita, Kanagawa (JP); Takashi Kondo, Kanagawa (JP); Junichiro Hayakawa, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 370 days.

(21) Appl. No.: 18/301,994

(22) Filed: Apr. 18, 2023

(65) Prior Publication Data

US 2024/0106194 A1     Mar. 28, 2024

(30) Foreign Application Priority Data

Sep. 27, 2022     (JP) ................................. 2022-154168

(51) Int. Cl.
H01S 5/042        (2006.01)
G01B 11/24        (2006.01)
(Continued)

(52) U.S. Cl.
CPC .............. H01S 5/042 (2013.01); G01B 11/24 (2013.01); G01S 7/484 (2013.01); G01S 17/89 (2013.01); H01S 5/42 (2013.01)

(58) Field of Classification Search
CPC ........ H01S 5/042; H01S 5/42; H01S 5/06226; H01S 5/18311; H01S 5/3095; H01S 5/0261; H01S 5/06216; H01S 5/0428; H01S 5/423; G01B 11/24; G01S 7/484; G01S 17/89; G01S 7/4815; G01S 17/894
See application file for complete search history.

(56) References Cited

U.S. PATENT DOCUMENTS

| | | | | |
|---|---|---|---|---|
| 7,948,004 | B2 * | 5/2011 | Suzuki | ............. G03G 15/04072 257/116 |
| 9,748,734 | B1 * | 8/2017 | Stiffler | .................. H01S 5/4025 |

(Continued)

FOREIGN PATENT DOCUMENTS

JP          2019057652          4/2019

OTHER PUBLICATIONS

"Notice of Reasons for Refusal of Japan Counterpart Application", issued on May 26, 2026, with English translation thereof, p. 1-p. 8.

*Primary Examiner* — Fernando Alcon

(74) *Attorney, Agent, or Firm* — JCIPRNET

(57) ABSTRACT

A light-emitting array includes a light-emitting part having plural light-emitting block, a selection part that operates with a reference potential supplied from a reference part provided on an outside as a reference and selects the light-emitting block to be made to emit light, and a disconnection part that disconnects connection of the selection part and the reference part in a period during which a light emission current caused by low-side drive is flowing in the light-emitting block.

16 Claims, 20 Drawing Sheets

(51) Int. Cl.
    *G01S 7/484*         (2006.01)
    *G01S 17/89*       (2020.01)
    *H01S 5/42*        (2006.01)

(56)               References Cited

U.S. PATENT DOCUMENTS

| | | | |
|---|---|---|---|
| 10,451,993 B2 | 10/2019 | Kondo | |
| 2013/0193464 A1* | 8/2013 | Bae | H10H 20/835 |
| | | | 257/94 |
| 2013/0234168 A1* | 9/2013 | Kinoshita | H10H 29/14 |
| | | | 257/88 |
| 2018/0062041 A1* | 3/2018 | Nakanishi | H10H 20/824 |
| 2018/0234584 A1* | 8/2018 | Kondo | H10H 29/10 |
| 2020/0209355 A1* | 7/2020 | Pacala | G01S 7/484 |
| 2020/0244039 A1* | 7/2020 | Kondo | H01S 5/426 |
| 2022/0308212 A1* | 9/2022 | Iguchi | G01S 17/36 |
| 2022/0311209 A1* | 9/2022 | Kondo | H01S 5/042 |
| 2023/0307885 A1* | 9/2023 | Kondo | H01S 5/04256 |
| 2023/0307893 A1* | 9/2023 | Kondo | H01S 5/0262 |
| 2023/0375681 A1* | 11/2023 | Iguchi | G01C 3/06 |
| 2024/0106193 A1* | 3/2024 | Nishizaki | G01S 17/10 |
| 2024/0106195 A1* | 3/2024 | Nishizaki | H01S 5/423 |
| 2025/0239832 A1* | 7/2025 | Iguchi | G01S 17/894 |

* cited by examiner

FIG. 2B

RELATED ART

COLLECTIVE IRRADIATION METHOD

FIG. 2A

FRACTIONATED IRRADIATION METHOD

SEQUENTIAL LIGHTING METHOD

MULTIPLE LIGHTING METHOD

FULL LIGHTING METHOD

100

LIGHT-EMITTING DEVICE 10'

LIGHT-EMITTING DEVICE 10'

LIGHT-EMITTING DEVICE WITH NO SHIFT PART

LIGHT-EMITTING DEVICE 10'

LIGHT-EMITTING DEVICE WITH NO SHIFT PART

LIGHT-EMITTING DEVICE 10'

LIGHT-EMITTING DEVICE WITH NO SHIFT PART

LIGHT-EMITTING DEVICE 10

LIGHT-EMITTING DEVICE WITH NO SHIFT PART

LIGHT-EMITTING ARRAY, LIGHT-EMITTING DEVICE, MEASUREMENT APPARATUS, AND METHOD FOR MANUFACTURING LIGHT-EMITTING ARRAY

CROSS-REFERENCE TO RELATED APPLICATIONS

This application is based on and claims priority under 35 USC 119 from Japanese Patent Application No. 2022-154168 filed Sep. 27, 2022.

BACKGROUND

(i) Technical Field

The present invention relates to a light-emitting array, a light-emitting device, a measurement apparatus, and a method for manufacturing a light-emitting array.

(ii) Related Art

JP2019-57652A describes a light-emitting component including a substrate, a plurality of light-emitting elements that are provided on the substrate and emit light in a direction crossing a front surface of the substrate, and a plurality of thyristors that are respectively laminated on a plurality of light-emitting elements and enter an on state to drive the light-emitting element to emit light or to increase an amount of light emission, in which each of the thyristors has an opening portion in a path of light from the light-emitting element toward the thyristor.

SUMMARY

In a measurement apparatus that measures a three-dimensional shape of an object to be measured using a time of flight (ToF) method, there is a demand for a light-emitting device that generates a light emission pulse having a fall or/and a rise in an order of hundreds of ps with a light emission current in an order of A. Note that, in the light-emitting device, the fall or/and the rise of the light emission pulse may be delayed due to electric charge accumulated in capacitance (electric capacitance) incidental to the light-emitting array that generates the light emission pulse.

Aspects of non-limiting embodiments of the present disclosure relates to a light-emitting array and the like that suppress an influence of capacitance on a waveform of a light emission pulse.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a light-emitting array including a light-emitting part having a plurality of light-emitting blocks, a selection part that operates with a reference potential supplied from a reference part provided on an outside as a reference and selects the light-emitting block to be made to emit light, and a disconnection part that disconnects connection of the selection part and the reference part in a period during which a light emission current caused by low-side drive is flowing in the light-emitting block.

BRIEF DESCRIPTION OF THE DRAWINGS

Exemplary embodiment(s) of the present invention will be described in detail based on the following figures, wherein:

FIGS. 2A and 2B are perspective views illustrating a distance measurement region that is irradiated with light by a light-emitting array of a light-emitting device, and specifically, FIG. 2A is a fractionated irradiation method to which a present exemplary embodiment is applied, and FIG. 2B is a collective irradiation method of the related art for comparison;

FIG. 4A is a sequential lighting method in which light-emitting blocks of the light-emitting part are sequentially lighted, FIG. 4B is a multiple lighting method in which a plurality of any light-emitting blocks of the light-emitting part are lighted in parallel, and FIG. 4C is a full lighting method in which all the light-emitting blocks of the light-emitting part are lighted in parallel;

FIG. 7A is a cross section taken along the line VIIA-VIIA of FIG. 6, and FIG. 7B is a cross section taken along the line VIIB-VIIB of FIG. 6;

FIG. 9A is an equivalent circuit, and FIG. 9B is a cross section in a portion of the shift thyristor and the coupling transistor;

FIGS. 10A and 10B are a light emission pulse waveform by the light-emitting device using the light-emitting array of the comparative example, and FIG. 10C is a light emission pulse waveform by a light-emitting device using a light-emitting array with no shift part;

FIG. 11A is an enlarged cross-sectional view, and FIG. 11B is an equivalent circuit of the portion shown in the enlarged cross-sectional view;

Figure 12:
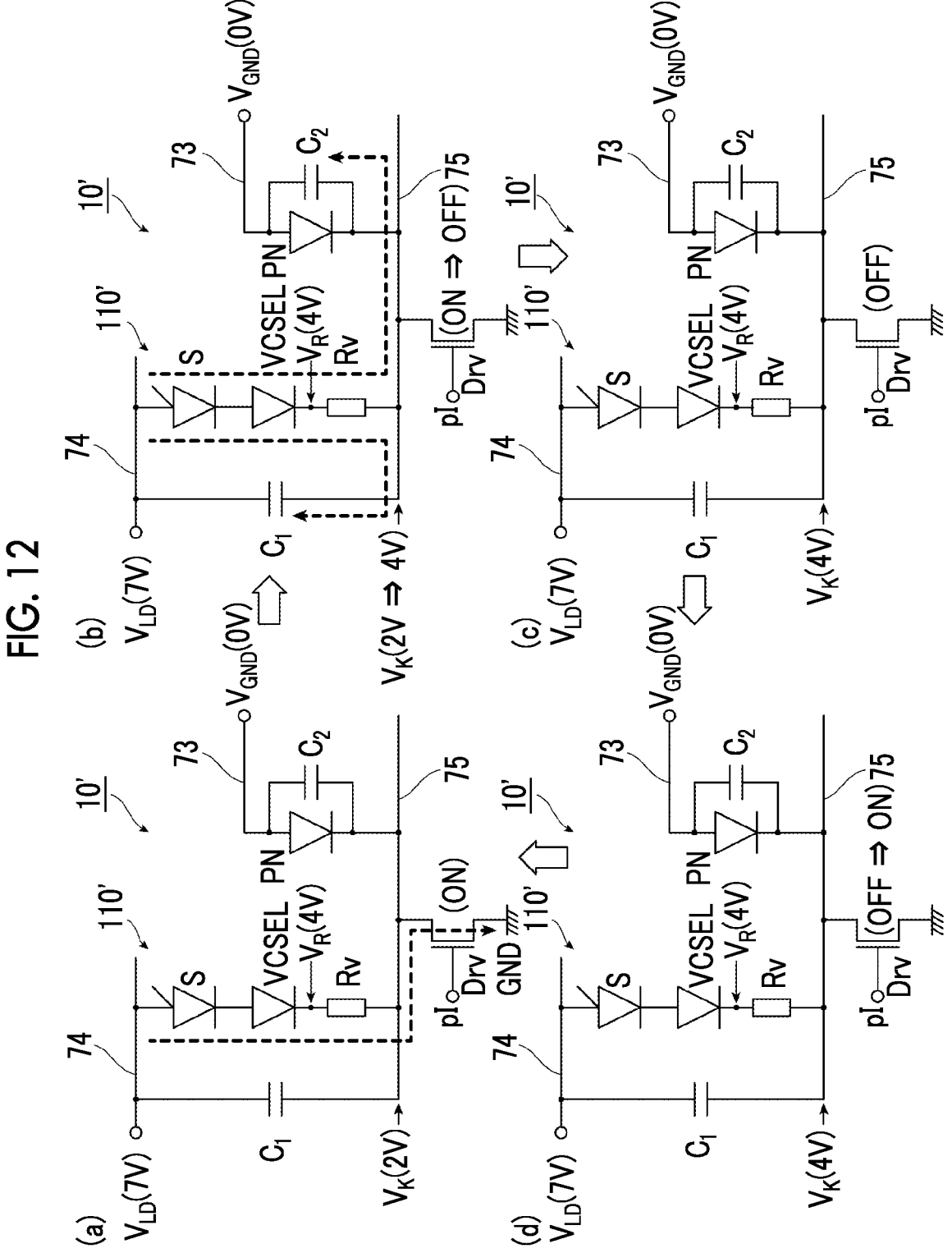
Figures 13A, 13B:
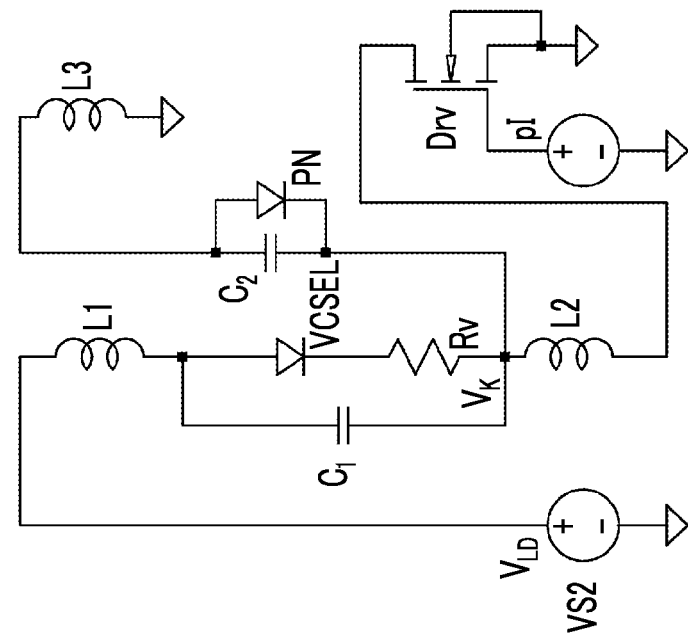
Figure 14A:
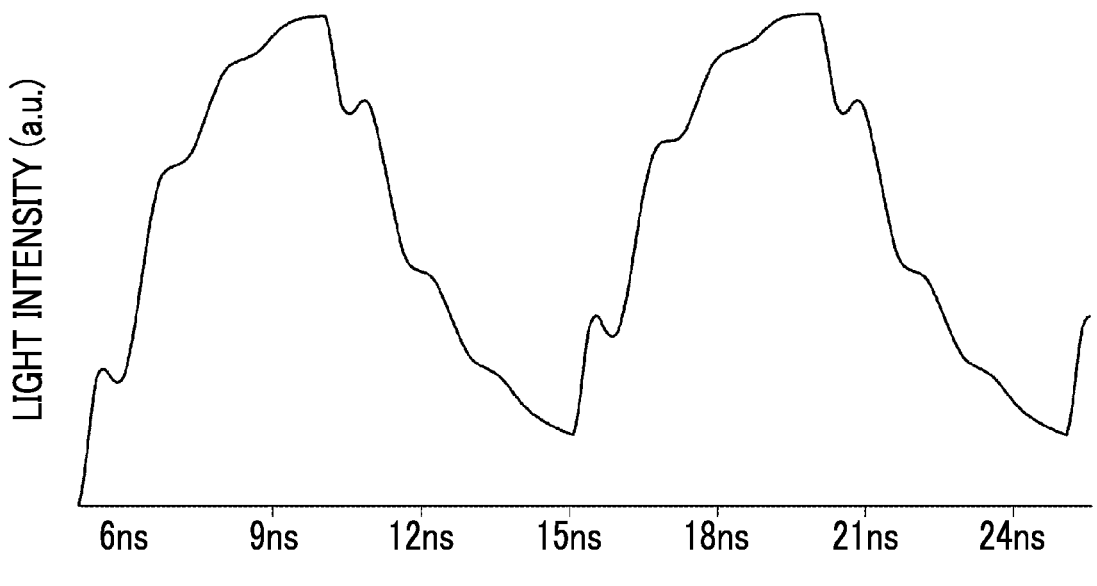
Figure 14B:
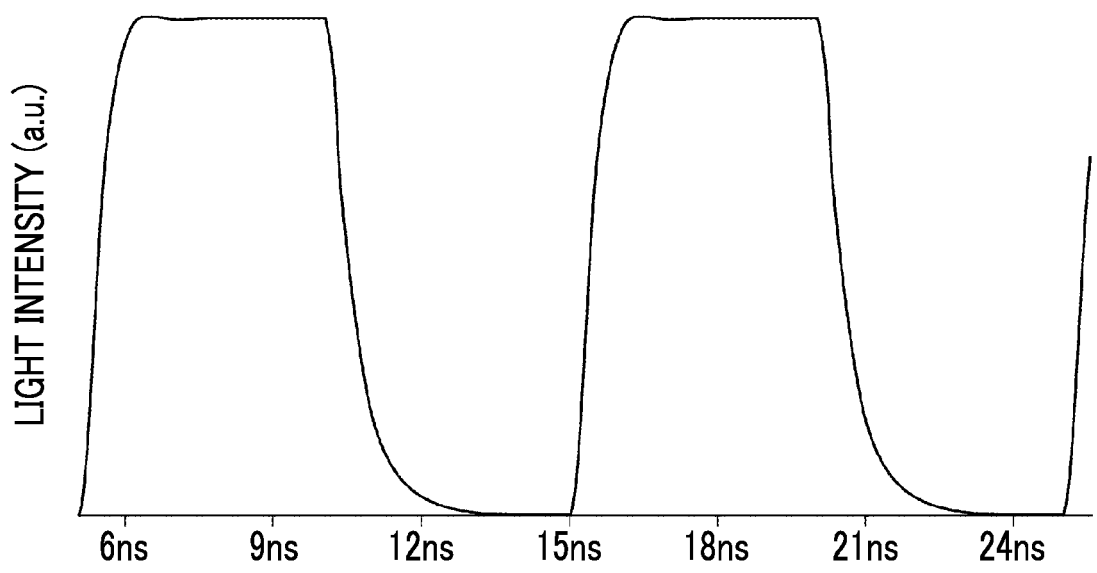
Figure 15:
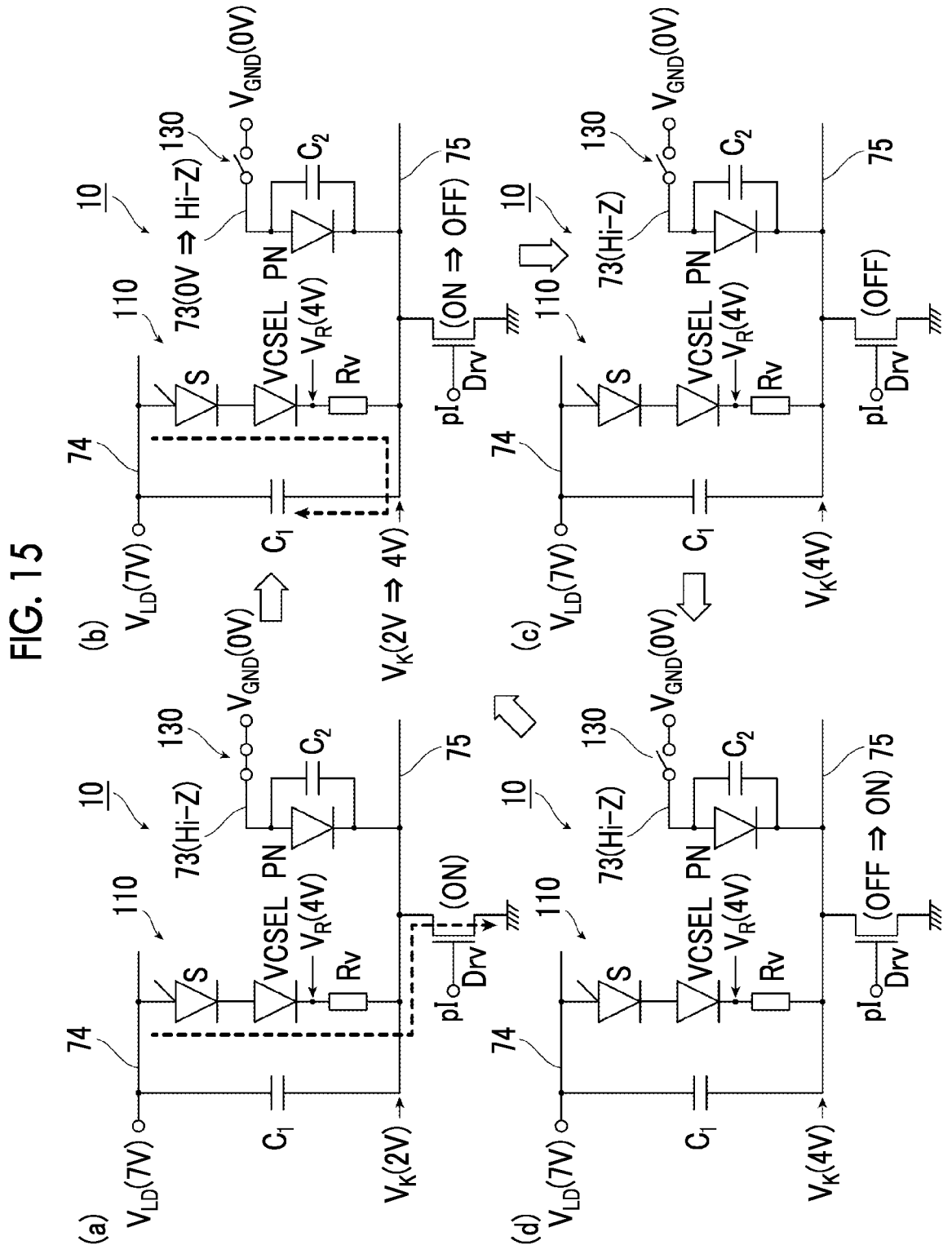
Figure 16:
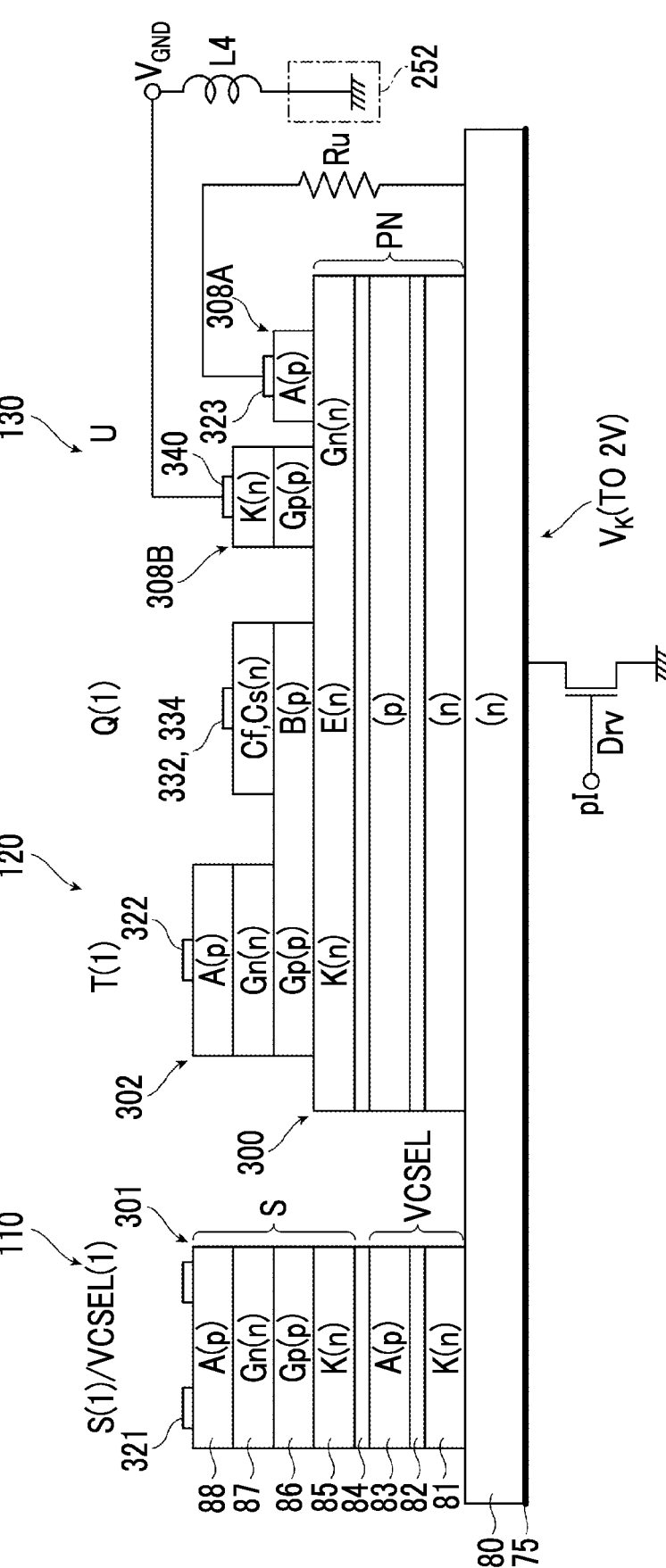

A part (a) in FIG. 12 to a part (d) in FIG. 12 is a diagram illustrating an influence of capacitance configured by a PN junction on the light emission pulse waveform in the light-emitting device of the comparative example, and specifically, A part (a) in FIG. 12 is a case where a driver is on, a part (b) in FIG. 12 is a case where the driver is shifted from on to off, a part (c) in FIG. 12 is a case where the driver is off, and a part (d) in FIG. 12 is a case where the driver is shifted from off to on;

FIGS. 13A and 13B are circuit models using a simulation for evaluating an influence of capacitance configured by a PN junction, and specifically, FIG. 13A is a circuit model of the light-emitting device of the comparative example, and FIG. 13B is a circuit model of a light-emitting device (a light-emitting device with no shift part) using the light-emitting array with no shift part;

FIGS. 14A and 14B are light emission pulse waveforms obtained by the simulation, and specifically, FIG. 14A is a case of the light-emitting device of the comparative example of FIG. 13A, and FIG. 14B is a case of the light-emitting device (light-emitting device with no shift part) using the light-emitting array with no shift part of FIG. 13B;

A part (a) in FIG. 15 to a part (d) in FIG. 15 is a diagram illustrating the operation of the light-emitting device to which the present exemplary embodiment is applied, and specifically, a part (a) in FIG. 15 is a case where a driver is on, a part (b) in FIG. 15 is a case where the driver is shifted from on to off, a part (c) in FIG. 15 is a case where the driver is off, and a part (d) in FIG. 15 is a case where the driver is shifted from off to on;

FIG. 16 is a cross-sectional view illustrating the structure of the disconnection thyristor in the light-emitting array to which the present exemplary embodiment is applied;

Figures 17A, 17B:
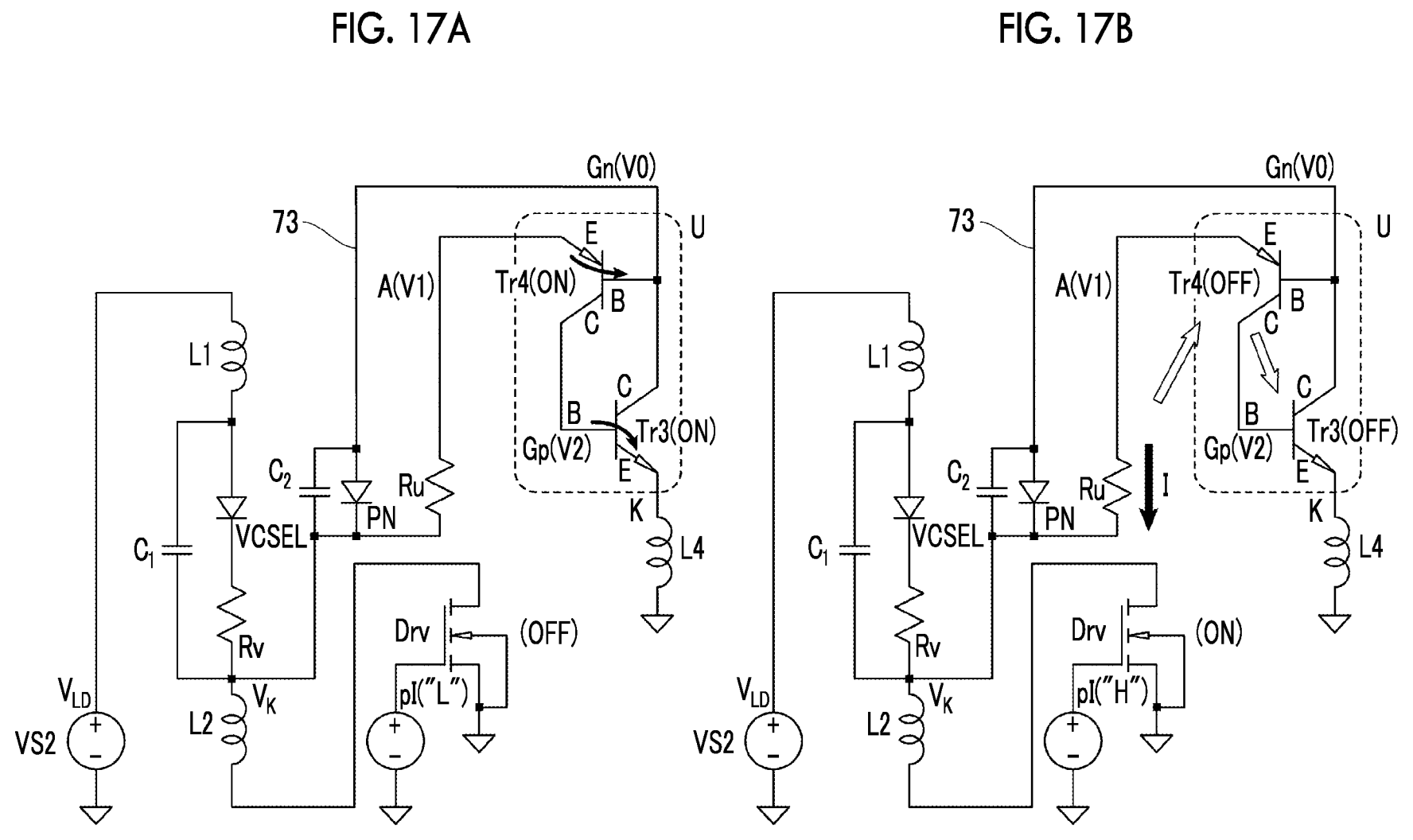

FIGS. 17A and 17B are circuit models with which the operation of the disconnection part to which the present exemplary embodiment is applied is simulated, and specifically, FIG. 17A is a case where the driver is on, and FIG. 17B shows a moment at which the driver is turned on.

Figure 18A:
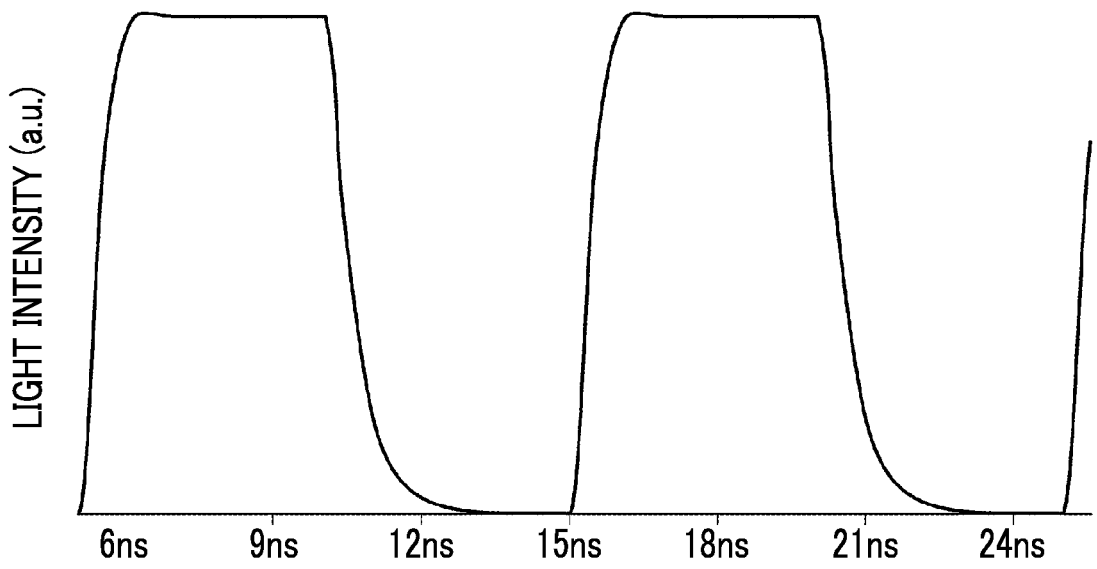
Figure 18B:
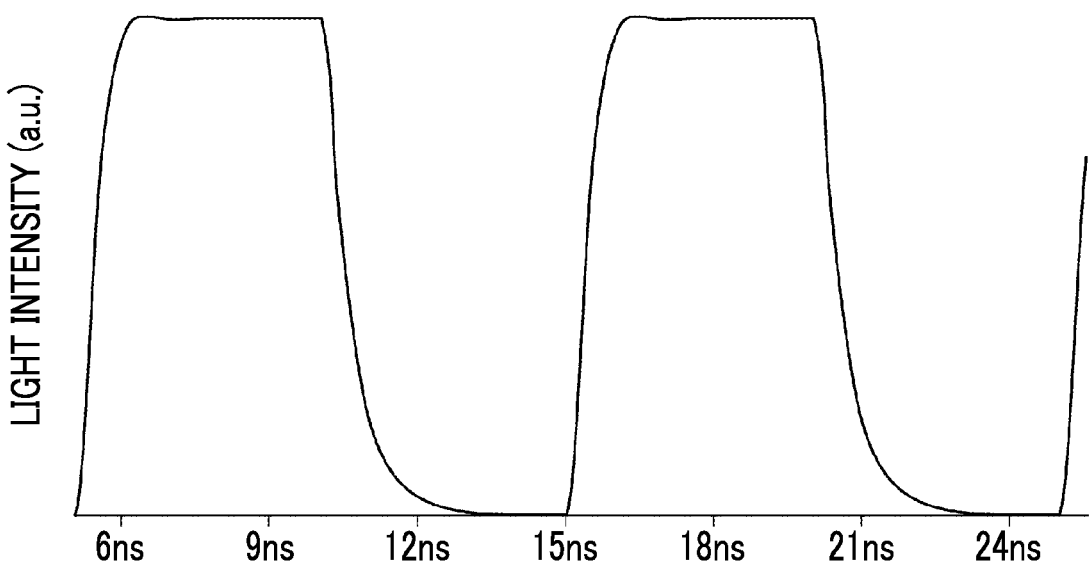
Figures 19D, 19E, 19F:
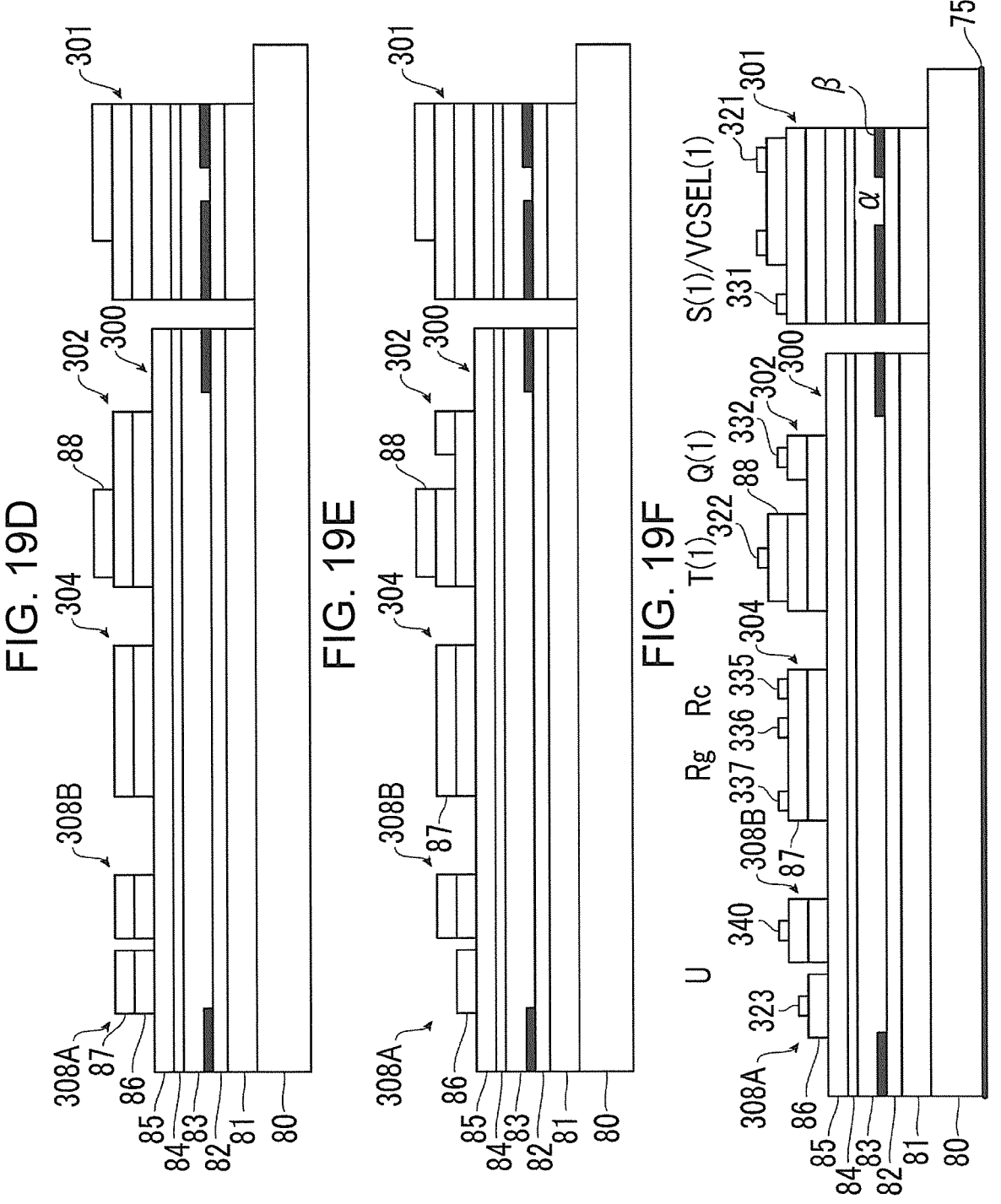

FIGS. 18A and 18B are light emission pulse waveforms obtained by a simulation, and specifically, FIG. 18A is a case of the light-emitting device to which the present exemplary embodiment is applied, and FIG. 18B is a case of the light-emitting device using the light-emitting array with no shift part;

Figures 19A, 19B, 19C:
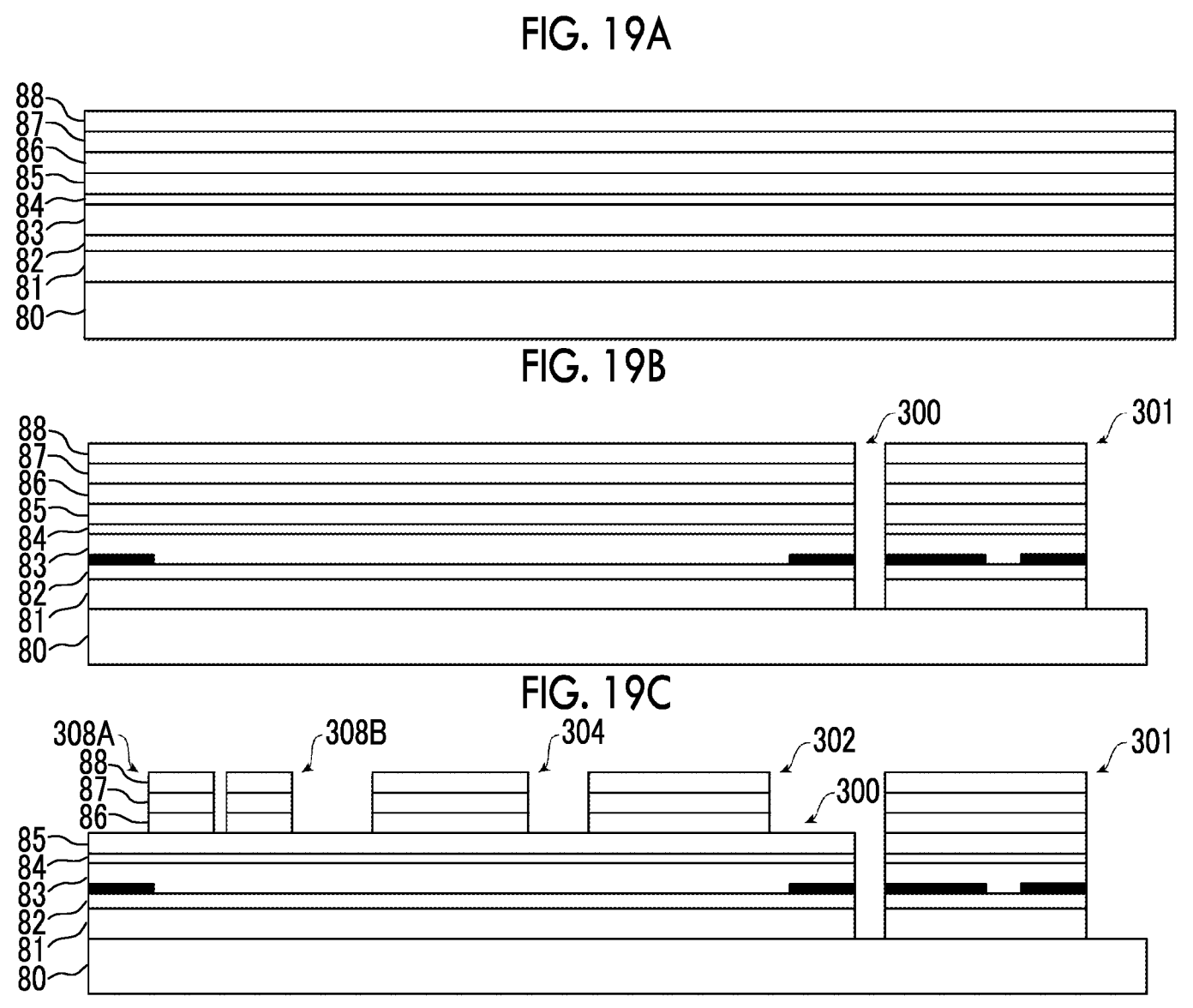

FIGS. 19A to 19C are process views illustrating a method for manufacturing a light-emitting array to which the present exemplary embodiment is applied, and specifically, FIG. 19A is a semiconductor layer laminate forming step, FIG. 19B is a separating and current blocking portion forming step, and FIG. 19C is a separating step in the shift part and the disconnection part; and FIGS. 19D to 19F are process views illustrating the method for manufacturing a light-emitting array to which the present exemplary embodiment is applied, and specifically, FIG. 19D is a n-type semiconductor layer exposure step, FIG. 19E is a coupling transistor and disconnection thyristor forming step, and FIG. 19F is an n-ohmic electrode, p-ohmic electrode, and substrate electrode forming step.

DETAILED DESCRIPTION

Hereinafter, exemplary embodiments of the invention will be described in detail referring to the accompanying drawings.

A measurement apparatus that measures a three-dimensional shape of an object to be measured based on a time of flight (ToF) method measures the three-dimensional shape of the object to be measured from a time of flight of light. That is, in the ToF method, the three-dimensional shape of the object to be measured is obtained by calculating a distance from a light-emitting device to the object to be measured from a time of flight of light from a timing at which the light-emitting device emits light to a timing at which a 3D sensor receives light reflected by the object to be measured. In measuring the three-dimensional shape of the object to be measured with high accuracy, there is a demand for a light pulse with a rising time and a falling time of hundreds of ps with a light emission current of several A.

Measurement Apparatus 1

Figure 1:
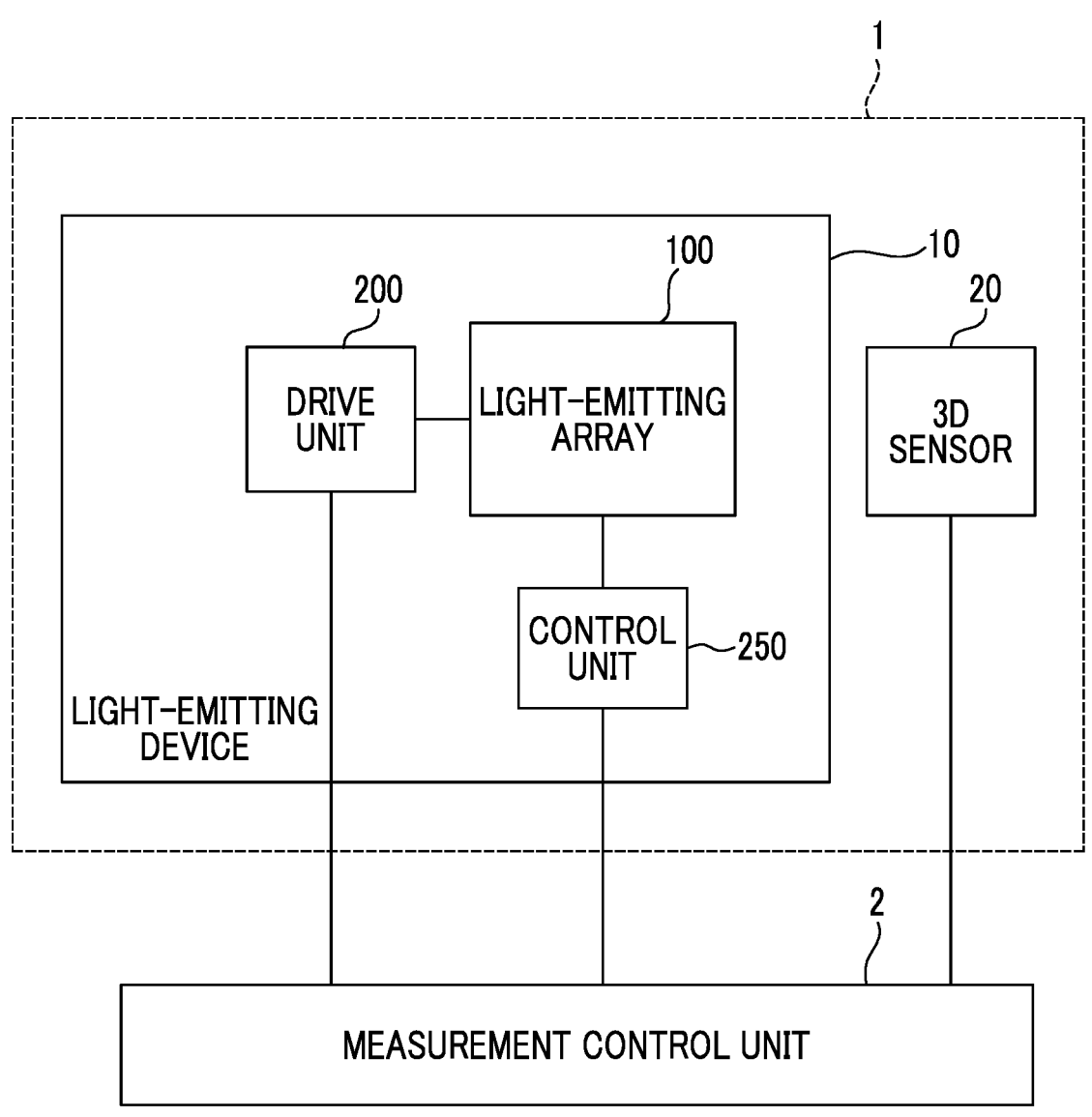
FIG. 1 is a block diagram illustrating the configuration of a measurement apparatus.

FIG. 1 is a block diagram illustrating the configuration of the measurement apparatus 1. The measurement apparatus 1 includes a light-emitting device 10 and a three-dimensional sensor 20 (hereinafter, denoted as a 3D sensor 20). The light-emitting device 10 includes a light-emitting array 100, a drive unit 200, and a control unit 250. FIG. 1 shows a measurement control unit 2 in addition to the measurement apparatus 1.

The light-emitting array 100 emits pulsed light toward the object to be measured. The drive unit 200 supplies a current (hereinafter, denoted as a light emission current) for light emission to the light-emitting array 100 under the control of the measurement control unit 2. Supplying the light emission current to the light-emitting array is denoted as driving the light-emitting array. The control unit 250 controls light emission/quenching of the light-emitting array 100 under the control of the measurement control unit 2. The 3D sensor 20 receives light (received light) that is emitted from the light-emitting array 100 and is reflected by the object to be measured. Then, the 3D sensor 20 outputs information (distance information) regarding the distance to the object to be measured based on a time (a time of flight of light) from the timing at which light is emitted to the timing at which reflected light is received. The 3D sensor 20 is an example of a light-receiving unit. In a case of indicating that light emitted from the light-emitting array 100 is pulsed, light is denoted as a light emission pulse, and a waveform of the light emission pulse is denoted as a light emission pulse waveform. Light emission from the light-emitting array 100 may be denoted as lighting. Similarly, stopping light emission from the light-emitting array 100 is denoted as quenching and may be denoted as lighting-off. That is, light emission and lighting are synonymous, and quenching and lighting-off are synonymous.

The measurement control unit 2 is configured with a computer including a CPU, a ROM, a RAM, and the like, and controls the measurement apparatus 1, acquires the distance information from the 3D sensor 20, and calculates the distance to the object to be measured based on the acquired distance information. Then, the measurement control unit 2 specifies the three-dimensional shape (hereinafter, denoted as a 3D shape) of the object to be measured from the calculated distance to the object to be measured. Specifying the 3D shape of the object to be measured may be denoted as three-dimensional measurement, 3D measurement, or 3D sensing. The measurement apparatus 1 may include the measurement control unit 2.

The measurement apparatus 1 is applied to recognizing the object to be measured from the specified 3D shape. For example, the measurement apparatus 1 is mounted in a portable information processing apparatus or the like and is used for recognizing a user who is to access the portable information processing apparatus. That is, the measurement apparatus 1 specifies a 3D shape of a face of the user who accesses the portable information processing apparatus, identifies whether or not the access is permitted, and permits the use of the apparatus (portable information processing apparatus) only in a case where recognition is made that the user is permitted to access the portable information processing apparatus.

The measurement apparatus 1 is applied to an information processing apparatus, such as a personal computer, other than the portable information processing apparatus. Then, the measurement apparatus 1 is also applied to a case where the 3D shape of the object to be measured is continuously measured, such as augmented reality (AR).

Fractionated Irradiation

Figures 2A, 2B:
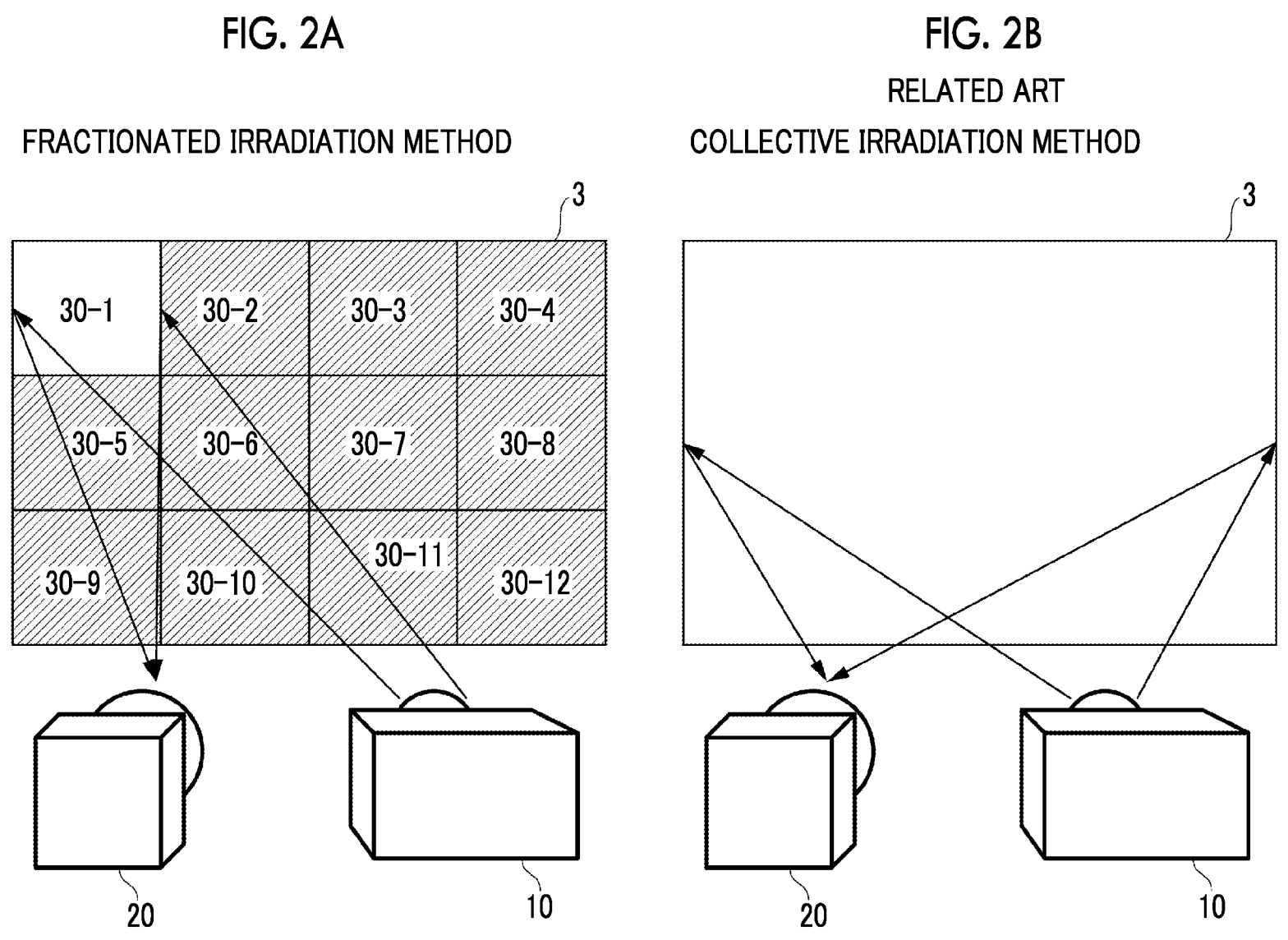

FIGS. 2A and 2B are perspective views illustrating a distance measurement region 3 that is irradiated with light by the light-emitting array 100 of the light-emitting device 10. FIG. 2A is a fractionated irradiation method to which the present exemplary embodiment is applied, and FIG. 2B is a collective irradiation method of the related art for comparison. The distance measurement region 3 is a range of irradiation of light emitted from the light-emitting array 100 to measure the 3D shape of the object to be measured. In a case where the object to be measured is presented in the distance measurement region 3, the 3D shape of the object to be measured is measured.

The distance measurement region 3 shown in FIG. 2A is divided into a plurality of distance measurement sections 30. In FIG. 2A, the distance measurement region 3 has twelve distance measurement sections 30 in total with an arrangement of four distance measurement sections in a lateral direction of a paper plane and three distance measurement sections in a longitudinal direction of the paper plane. The distance measurement sections 30 are denoted as distance measurement sections 30-1, 30-2, . . . , and 30-12 in a case of being distinguished individually. Then, the light-emitting array 100 correspondingly irradiates the distance measurement sections 30 with light, that is, irradiates each of the distance measurement sections 30 with light. For example, the light-emitting device 10 performs irradiation of light in an order of the distance measurement sections 30-1, 30-2, . . . (corresponding to a sequential lighting method of FIG. 4A described below). Similarly, the 3D sensor 20 receives reflected light from the distance measurement sections 30-1, 30-2, . . . in an order of the distance measurement sections 30-1, 30-2, . . . . In FIG. 2A, the distance measurement section 30-1 is irradiated with light, and other distance measurement sections 30 that are not irradiated with light are hatched. From the fact that the distance measurement region 3 is divided into a plurality of distance measurement sections 30, and the distance measurement sections 30 are correspondingly irradiated with light pulses, this irradiation method is denoted as a fractionated irradiation method. The fractionated irradiation method includes a case where a plurality of distance measurement sections 30 are irradiated in parallel, in addition to a case where the distance measurement sections 30 are irradiated with light in the above-described order.

On the other hand, in FIG. 2B, the distance measurement region 3 is not divided into the distance measurement sections 30, and the light-emitting array 100 collectively irradiates the entire surface of the distance measurement region 3 with light. Then, the 3D sensor 20 collectively receives reflected light from the entire surface of the distance measurement region 3. This irradiation method is denoted as a collective irradiation method.

In the fractionated irradiation method, the distance measurement sections 30 obtained by dividing the distance measurement region 3 are irradiated with light. Accordingly, in the fractionated irradiation method, the power consumption per unit time of the light-emitting device 10 is small compared to the collective irradiation method. For example, in the fractionated irradiation method, a current flowing in the light-emitting device 10 is small and generation of heat from the light-emitting device 10 is suppressed, compared to the collective irradiation method. In addition, in the fractionated irradiation method, since the current flowing in the light-emitting device 10 is small, the light-emitting device 10 is small in size compared to the collective irradiation method. Accordingly, in a case where the measurement apparatus 1 is applied to the portable information processing apparatus, an increase in temperature of the portable information processing apparatus is suppressed. Furthermore, a drive time of the portable information processing apparatus is extended.

Figure 3:
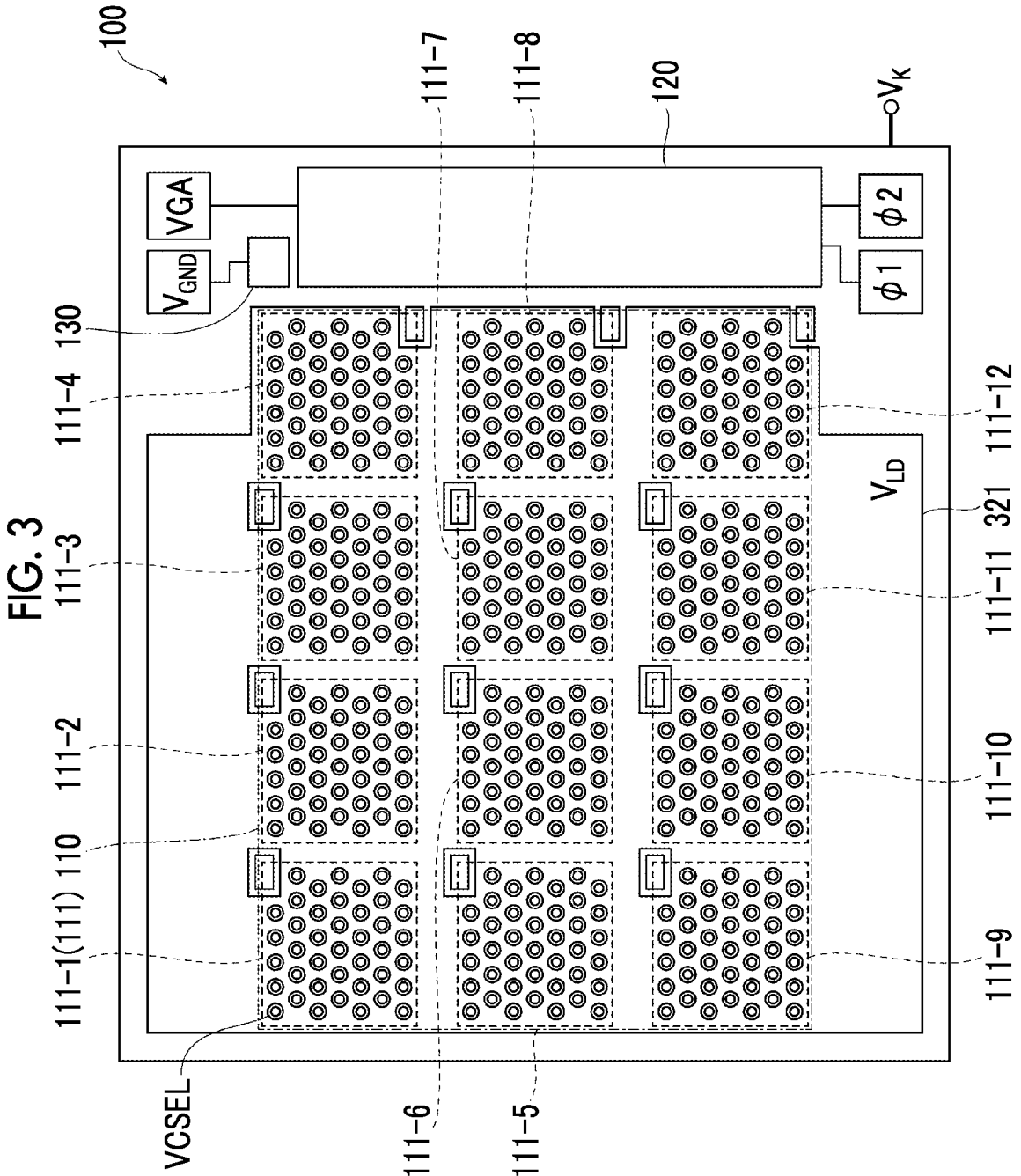
FIG. 3 is a diagram illustrating an example of a plan view of the light-emitting array.

FIG. 3 is a diagram illustrating an example of a plan view of the light-emitting array 100.

The light-emitting array 100 is configured with a semiconductor layer laminate in which a plurality of group III-V compound semiconductor layers epitaxially grown on a substrate (an n-type semiconductor substrate 80 shown in FIGS. 7A and 7B described below) configured with a group III-V compound semiconductor, as an example. That is, the light-emitting array 100 is configured monolithically. For example, the light-emitting array 100 is configured as one semiconductor component, and further, as one semiconductor chip.

The light-emitting array 100 includes a light-emitting part 110 including a plurality of light-emitting blocks 111, a shift part 120, a disconnection part 130, and terminals ($\varphi$1 terminal, $\varphi$2 terminal, VGA terminal, $V_{GND}$ terminal, $V_{LD}$ terminal, and $V_K$ terminal). In FIG. 3, as an example, the light-emitting part 110 includes 12 light-emitting blocks 111 with an arrangement of four light-emitting blocks in a lateral direction (one direction) of a paper plane and three light-emitting blocks in a longitudinal direction (a direction perpendicular to one direction) of the paper plane. The light-emitting blocks 111 are denoted as light-emitting blocks 111-1, 111-2, . . . , and 111-12 in a case of being distinguished individually. The light-emitting blocks 111 may be denoted as a light-emitting region.

The light-emitting blocks 111 are units in which light emission/quenching (denoted as lighting/lighting-off) is controlled. As an example, each light-emitting block 111 includes 41 light-emitting elements. In the light-emitting elements included in one light-emitting block 111, light emission/quenching is controlled as a whole. The light-emitting block 111 may include one light-emitting element or may be light-emitting elements other than 41. The light-emitting elements in the light-emitting block 111 may be arranged at apexes of triangles adjacent to each other (see FIG. 3) or may be arranged by other methods, such as arranging at apexes of a plurality of adjacent quadrangles.

The light-emitting element includes a vertical cavity surface emitting laser (VCSEL) as an example. Hereinafter, description will be provided regarding the light-emitting element including a vertical cavity surface emitting laser VCSEL, and the light-emitting element is denoted as a VCSEL.

The light-emitting blocks 111 correspond to the distance measurement sections 30 in the distance measurement region 3 shown in FIG. 2A on a one-to-one basis. For example, the light-emitting block 111-1 irradiates the distance measurement section 30-1 with light, and the light-emitting block 111-2 irradiates the distance measurement section 30-2 with light. The same applies hereinafter. A combination of the light-emitting block 111 and the distance measurement section 30 may be other combinations, such as corresponding a number (a number after –) of the light-emitting block 111 to a number (a number after –) of the distance measurement section 30 such that the light-emitting block 111-1 irradiates the distance measurement section 30-12 with light.

The shift part 120 is connected to the light-emitting part 110 and selects the light-emitting block 111 to be lighted by a shift operation. The shift part 120 is an example of a selection part. The disconnection part 130 is provided between the shift part 120 and a reference part 252 in the control unit 250 described below, and disconnects direct-current connection of the reference part 252 and the shift part 120.

The φ1 terminal, the φ2 terminal, the VGA terminal, the $V_{GND}$ terminal, and the $V_{LD}$ terminal are provided on a front surface side of the light-emitting array 100, and the $V_K$ terminal is provided on a rear surface side of the light-emitting array 100 (a rear surface of the n-type semiconductor substrate 80 shown in FIGS. 7A and 7B described below). As described below, signal or potentials for operating the shift part 120 are supplied to the φ1 terminal, the φ2 terminal, the VGA terminal, and the $V_{GND}$ terminal. The $V_{LD}$ terminal is a substrate electrode 75 that is connected to a p-ohmic electrode 321 of the VCSEL and is provided to cover a front surface side of the light-emitting part 110 (see FIGS. 6 and 7A described below). The light emission current is supplied from the $V_{LD}$ terminal to the VCSEL.

The shift part 120, the disconnection part 130, and the reference part 252 will be described below in detail.

Figures 4A, 4B, 4C:
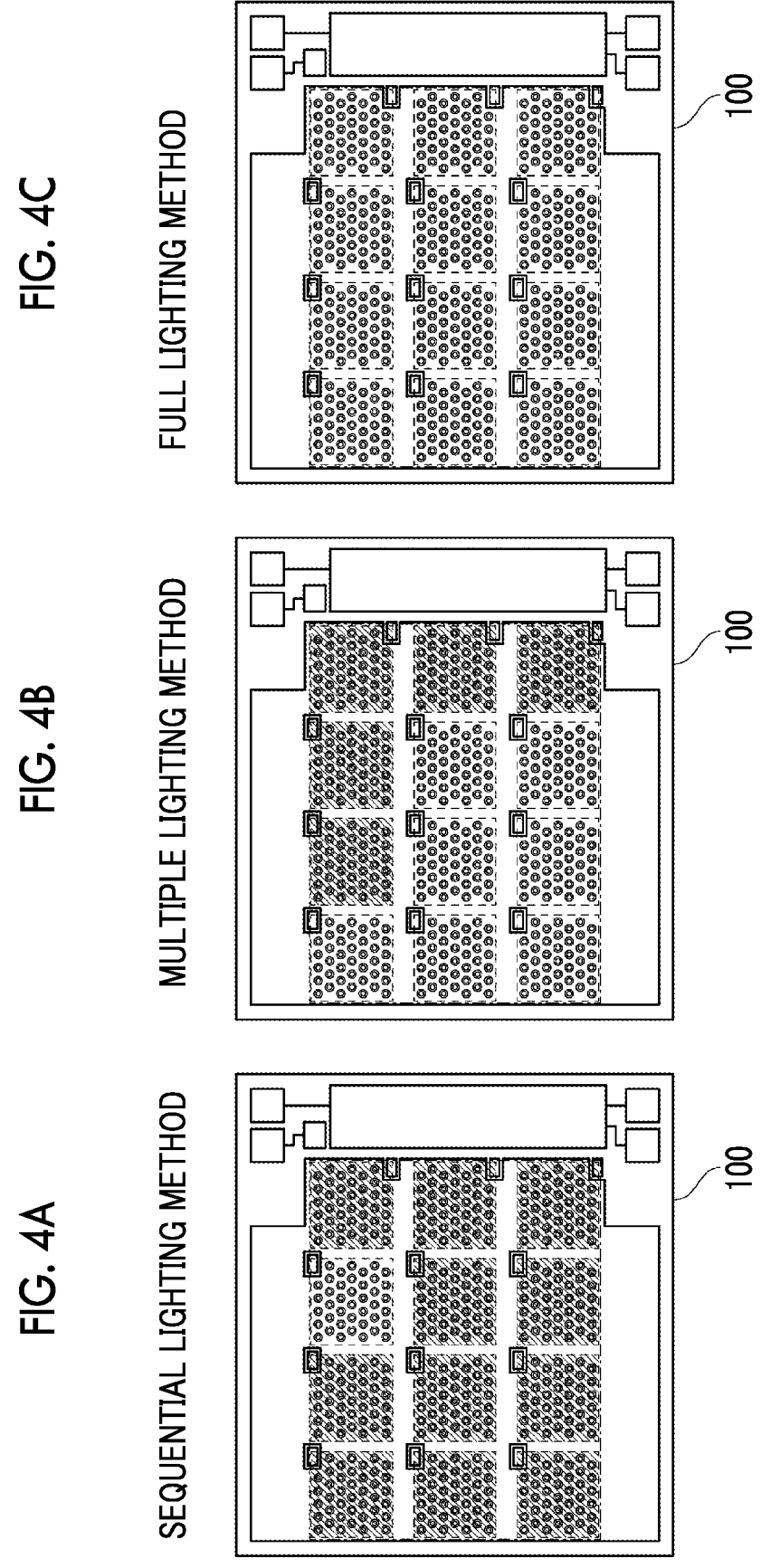
FIGS. 4A to 4C are diagrams illustrating a lighting method of the light-emitting part in the light-emitting array, and specifically.

FIGS. 4A to 4C are diagrams illustrating a lighting method of the light-emitting part 110 in the light-emitting array 100. FIG. 4A is a sequential lighting method in which the light-emitting blocks 111 of the light-emitting part 110 are sequentially lighted, FIG. 4B is a multiple lighting method in which a plurality of any light-emitting blocks 111 of the light-emitting part 110 are lighted in parallel, and FIG. 4C is a full lighting method in which all of the light-emitting blocks 111 of the light-emitting part 110 are lighted in parallel. In FIGS. 4A and 4B, the light-emitting blocks 111 that are being lighted off are hatched.

In the sequential lighting method of FIG. 4A, for example, the light-emitting blocks 111 are lighted in an order of the light-emitting blocks 111-1, 111-2, . . . . That is, one light-emitting block 111 is lighted at one time, and other light-emitting blocks 111 are in a state of being lighted off. Then, the light-emitting block 111 that is lighted is shifted in order.

In the multiple lighting method of FIG. 4B, a plurality of light-emitting blocks 111 selected in advance are lighted in parallel. The light-emitting blocks 111 that are lighted in parallel are selected optionally.

In the full lighting method of FIG. 4C, all of the light-emitting blocks 111 included in the light-emitting part 110 are lighted in parallel. This method corresponds to a case where all of the light-emitting blocks 111 are selected as the light-emitting blocks 111 to be lighted in the multiple lighting method. The full lighting method is similar to the collective irradiation method shown in FIG. 2B, and may be used in combination with the sequential lighting method or/and the multiple lighting method. For example, in a case of detecting whether or not the object to be measured is present in the distance measurement region 3, in advance, the entire surface of the distance measurement region 3 is irradiated with light by full lighting, and determination is performed whether or not the object to be measured is present. Then, in a case where determination is made that the object to be measured is present, the 3D shape of the object to be measured is measured by sequential lighting or multiple lighting. In this case, in full lighting, the intensity of light with which the distance measurement region 3 is irradiated may be weakened compared to sequential lighting or multiple lighting to suppress power consumption or an increase in temperature.

Equivalent Circuit of Light-Emitting Array 100

Figure 5:
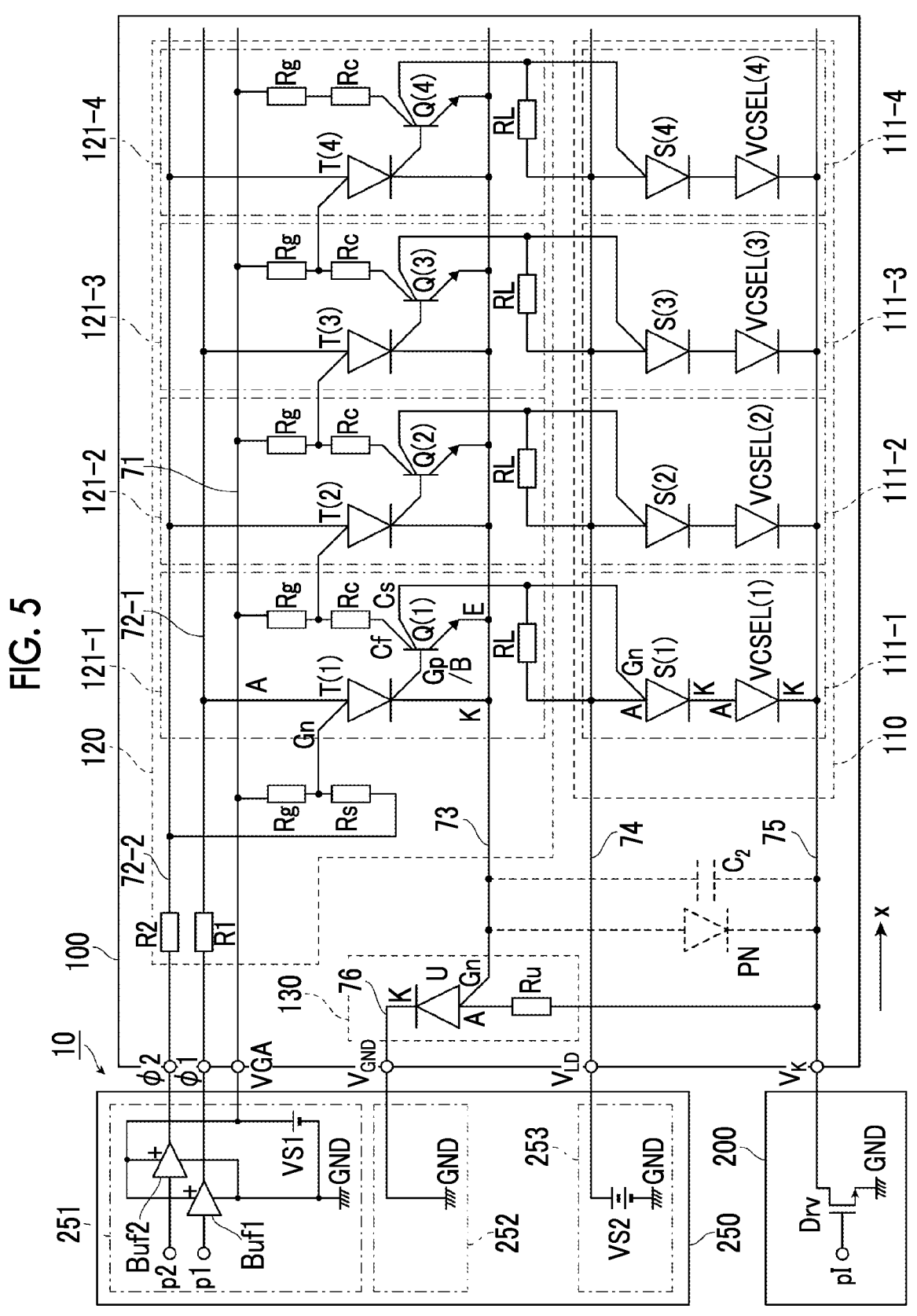
FIG. 5 is an example of an equivalent circuit of the light-emitting device to which the present exemplary embodiment is applied.

FIG. 5 is an example of an equivalent circuit of the light-emitting device 10 to which the present exemplary embodiment is applied. In FIG. 5, thyristors and transistors are indicated by symbols, and resistors have a rectangular shape. The same also applies to other cases. As shown in FIG. 1, the light-emitting device 10 includes the light-emitting array 100, the drive unit 200, and the control unit 250. In the light-emitting array 100, a right direction of the paper plane is referred to as a +x direction.

Light-Emitting Array 100

The light-emitting array 100 includes the light-emitting part 110 having a plurality of light-emitting blocks 111, the shift part 120, the disconnection part 130, and the terminals (φ1 terminal, φ2 terminal, VGA terminal, $V_{GND}$ terminal, $V_{LD}$ terminal, and $V_K$ terminal). In the light-emitting array 100 shown in FIG. 5, unlike the arrangement shown in FIG. 3, the terminals (φ1 terminal, φ2 terminal, VGA terminal, $V_{GND}$ terminal, $V_{LD}$ terminal, and $V_K$ terminal) are denoted in an end portion on one side (−x direction side). Then, the shift part 120 is denoted on an upper side of the paper plane, the light-emitting part 110 is denoted on a lower side of the paper plane, and the disconnection part 130 is denoted between the $V_{GND}$ terminal and the shift part 120.

Shift signals φ1 and φ2 that operate the shift part 120 are supplied to the φ1 and φ2 terminals. A potential (power supply potential VGA) that drives the shift part 120 is supplied to the VGA terminal. A reference potential (here, ground potential GND) that supplies a current for operating to the shift part 120 is supplied to the $V_{GND}$ terminal. A potential (light emission potential $V_{LD}$) that supplies a current for lighting to the VCSEL of the light-emitting part 110 is supplied to the $V_{LD}$ terminal. The $V_K$ terminal is a rear electrode (substrate electrode 75) provided on the rear surface of the substrate (n-type semiconductor substrate 80 shown in FIGS. 7A and 7B described below) of the light-emitting array 100. A potential of the substrate is denoted as a substrate potential $V_K$.

In FIG. 5, description will be provided regarding each light-emitting block 111 of the light-emitting part 110 including one VCSEL and one light emission control thyristor S. The VCSEL and the light emission control thyristor S are connected in series. As shown in FIG. 3, in a case where each light-emitting block 111 includes a plurality of VCSELs, a configuration in which a plurality of VCSELs and light emission control thyristors S are connected in parallel, and the VCSELs are lighted in parallel may be used.

As shown in FIG. 5, in the light-emitting block 111-1, the VCSEL is denoted as a VCSEL(1) and the light emission control thyristor S is denoted as a light emission control thyristor S(1), and in the light-emitting block 111-2, the VCSEL is denoted as a VCSEL(2) and the light emission control thyristor S is denoted as a light emission control thyristor S(2). The same also applies to other light-emitting blocks 111. Then, in FIG. 5, four light-emitting blocks 111 (light-emitting blocks 111-1 to 111-4) are shown. That is, in FIG. 5, the VCSEL(1) to the VCSEL(4) and the light emission control thyristors S(1) to S(4) are shown. Then, the four VCSELs and the four light emission control thyristors S are arranged from one side (−x direction side) toward the other side (+x direction side). Here, it is assumed that a light-emitting element is the light emission control thyristor S and the VCSEL connected in series. Note that a light-emitting element may be a thyristor, such as the light emission control thyristor S, and an element in which a pn junction in a thyristor emits light.

The shift part 120 selects the light-emitting block 111 to be lighted as described above. Here, the shift part 120 functions as a shift circuit that an on state is shifted in order by a shift operation. The shift part 120 has a plurality of shift thyristors T, coupling transistors Q, a plurality of power supply line resistors Rg, a plurality of current-limiting resistors RL, and a plurality of coupling resistors Rc. A shift unit 121 is configured by one shift thyristor T, one coupling transistor Q, one power supply line resistor Rg, one current-limiting resistor RL, and one coupling resistor Rc. In FIG. 5, four shift units 121 (shift units 121-1 to 121-4) are arranged from one side (−x direction side) toward the other side (+x direction side). In the shift unit 121-1, the shift thyristor T is denoted as a shift thyristor T(1) and the coupling transistor Q is denoted as a coupling transistor Q(1), and in the shift unit 121-2, the shift thyristor T is denoted as a shift thyristor T(2) and the coupling transistor Q is denoted as a coupling transistor Q(2). The same also applies to other shift units 121. That is, in FIG. 5, the shift thyristors T(1) to T(4) and the coupling transistors Q(1) to Q(4) are shown. The power supply line resistors Rg, the current-limiting resistors RL, and the coupling resistor Rc are not numbered. The shift part 120 includes a power supply line resistor Rg and a start resistor Rs in an end portion on one side (−x direction side). In addition, the shift part 120 includes current-limiting resistors R1 and R2. The shift thyristor is an example of a second thyristor.

In the shift unit 121, the shift thyristor T and the coupling transistor Q are connected. The coupling transistor Q in the shift unit 121 is connected to the light emission control thyristor S of the light-emitting block 111. That is, the shift thyristor T and the coupling transistor Q with the same number shown in ( ) are connected, and the coupling transistor Q and the light emission control thyristor S with the same number are connected.

The disconnection part 130 includes a disconnection thyristor U and a resistor Ru. The disconnection thyristor is an example of a first thyristor.

Next, a connection relationship will be described.

In the light-emitting array 100, the VGA terminal is connected to a power supply line 71, the φ1 terminal is connected to a shift signal line 72-1, the φ2 terminal is connected to a shift signal line 72-2, the $V_{LD}$ terminal is connected to a light emission potential line 74, and the $V_{GND}$ terminal is connected to a reference potential line 76. The $V_K$ terminal is the substrate electrode 75. A cathode K of the shift thyristor T and an emitter E of the coupling transistor Q of the shift unit 121 are connected to a shift part reference potential line 73. In FIG. 5, although a line is shown as the shift part reference potential line 73, as shown in FIGS. 7A and 7B described below, the shift part reference potential line 73 is an n-type semiconductor layer 85, and a potential of the shift part reference potential line 73 during the operation of the shift part 120 is set to the ground potential GND that is the reference potential. The n-type semiconductor layer 85 is provided on the p-type semiconductor layer 83 with a tunnel junction layer 84 interposed therebetween. Accordingly, the n-type semiconductor layer 85 and the p-type semiconductor layer 83 are at the same potential.

The shift signal lines 72-1 and 72-2 are denoted as shift signal lines 72 in a case of being not distinguished individually.

Though details will be described below, a pn junction and capacitance $C_2$ incidental to the pn junction are configured between the shift part reference potential line 73 (n-type semiconductor layer 85) and the substrate electrode 75 (n-type semiconductor substrate 80). The pn junction between the shift part reference potential line 73 (n-type semiconductor layer 85) and the substrate electrode 75 (n-type semiconductor substrate 80) is denoted as a PN junction. In FIG. 5, the PN junction and the capacitance $C_2$ are shown by broken lines.

The shift thyristor T and the light emission control thyristor S are thyristors having an npnp structure. The thyristor includes an n-type cathode K (hereinafter, denoted as a cathode K; the same applies hereinafter), a p-type gate Gp (a p-gate Gp), an n-type gate Gn (an n-gate Gn), and a p-type anode A (an anode A). The light emission control thyristor S does not use the p-gate Gp for control, and the p-gate Gp is not denoted.

The coupling transistor Q is a multi-collector npn bipolar transistor. The coupling transistor Q includes an n-type emitter E (emitter E), a p-type base B (base B), and n-type collector Cf and Cs (collectors Cf and Cs).

The VCSEL is a light-emitting element having a pn structure, and includes a p-type anode A (anode A) and an n-type cathode K (cathode K).

The above-described reference numerals are used without being distinguished between the thyristors and between the coupling transistors. The same also applies to a bipolar transistor that configures a thyristor described below. Note that the thyristor is configured by a combination of a single collector npn bipolar transistor and a pnp bipolar transistor. Accordingly, the collector is denoted as a collector C. Note that, in the drawings, the above-described reference numerals are attached to the shift thyristor T(1), the coupling transistor Q(1), the light emission control thyristor S(1), the VCSEL(1), and the disconnection thyristor U, and reference numerals to others may be omitted.

Hereinafter, the light emission control thyristor S may be denoted as a light emission control thyristor, the shift thyristor T may be denoted as a shift thyristor, and the coupling transistor Q may be denoted as a coupling transistor. The light emission control thyristor S and the shift thyristor T may be denoted as thyristors without being distinguished.

Hereinafter, a connection relationship in the shift unit 121-1 will be described.

The cathode K of the shift thyristor T(1) is connected to the shift part reference potential line 73. The anode A of the shift thyristor T(1) is connected to the shift signal line 72-1. The shift signal line 72-1 is connected to the φ1 terminal to which a shift signal p1 is supplied. The n-gate Gn of the shift thyristor T(1) is connected to a connection point of the start resistor Rs and the power supply line resistor Rg connected in series. The other end (an end opposite to the connection point) of the start resistor Rs is connected to the shift signal line 72-2. The other end (an end opposite to the connection point) of the power supply line resistor Rg is connected to the power supply line 71. The power supply line 71 is connected to the VGA terminal to which the power supply potential VGA is supplied.

The base B of the coupling transistor Q(1) is connected to the p-gate Gp of the shift thyristor T(1). The emitter E of the coupling transistor Q(1) is connected to the shift part reference potential line 73. The collector Cf of the coupling transistor Q(1) is connected to the power supply line 71 via the coupling resistor Rc and the power supply line resistor Rg connected in series. A connection point of the coupling resistor Rc and the power supply line resistor Rg is connected to the n-gate Gn of the shift thyristor T(2).

The collector Cs of the coupling transistor Q(1) is connected to the light emission potential line 74 via the current-limiting resistor RL. The light emission potential line 74 is connected to the V$_{LD}$ terminal to which the light emission potential V$_{LD}$ is supplied.

The anode A of the shift thyristor T(2) is connected to the shift signal line 72-2. That is, the anode A of the odd-numbered shift thyristor T is connected to the shift signal line 72-1, and the anode A of the even-numbered shift thyristor T is connected to the shift signal line 72-2. Except for the connection relationship of the shift thyristor T with the shift signal lines 72-1 and 72-2, the connection relationship of the shift thyristors T, the coupling transistors, the light emission control thyristors S, and the VCSELs with other numbers including the number 2 attached is the same as the connection relationship of the shift thyristor T(1), the coupling transistor Q(1), the light emission control thyristor S(1), and the VCSEL(1).

Next, a connection relationship in the light-emitting block 111-1 will be described.

The cathode K of the light emission control thyristor S(1) and the anode A of the VCSEL(1) are connected. That is, the light emission control thyristor S(1) and the VCSEL(1) are connected in series. The anode A of the light emission control thyristor S(1) is connected to the light emission potential line 74. The cathode K of the VCSEL(1) is connected to the substrate electrode 75. Then, the n-gate Gn of the light emission control thyristor S(1) is connected to the collector Cs of the coupling transistor Q(1).

Next, a connection relationship in the disconnection part 130 will be described.

The disconnection thyristor U of the disconnection part 130 is a thyristor having an npnp structure. The cathode K of the disconnection thyristor U is connected to the reference potential line 76. The reference potential line 76 is connected to the V$_{GND}$ terminal. The anode A of the disconnection thyristor U is connected to the substrate electrode 75 via the resistor Ru. The n-gate Gn of the disconnection thyristor U is connected to the shift part reference potential line 73.

Drive Unit 200

The drive unit 200 generates a light emission signal pI and supplies a light emission current to the VCSEL of the light-emitting part 110 to make the VCSEL emit light.

The drive unit 200 includes a driver Drv. The driver Drv includes, for example, an NMOS transistor as a drive element. The NMOS transistor has a source connected to the ground potential GND that is the reference potential and a drain connected to the V$_K$ terminal (substrate electrode 75). The NMOS transistor is set to on or off by the light emission signal pI applied to a gate. In a case where the light emission signal pI becomes an H level (denoted as "H"), the driver Drv is turned on. Then, the drain of the NMOS transistor is at the ground potential GND (0 V), and the V$_K$ terminal of the light-emitting array 100 changes toward the ground potential GND (0 V). In a case where the light emission signal pI becomes an L level (denoted as "L"), the driver Drv is turned off. The NMOS transistor makes the light emission current flow in the VCSEL by a constant current operation. Instead of the NMOS transistor, other elements, such as an insulated gate bipolar transistor IGBT, may be used. Although the drive unit 200 generates the light emission signal pI, the light emission signal pI may be received from the measurement control unit 2. The drive unit 200 and the measurement control unit 2 may be combined as a drive unit.

The drive unit 200 drives the VCSEL in the light-emitting array 100 by so-called low-side drive. The low-side drive refers to a configuration in which a drive element, such as a NMOS transistor, is positioned downstream of a current path with respect to a drive target, such as the VCSEL. In the low-side drive, the VCSEL is driven at a higher speed than high-side drive having a configuration in which a drive element is positioned on an upstream side.

Control Unit 250

The control unit 250 includes a power supply/shift signal part 251, a reference part 252, and a light emission power supply part 253.

The power supply/shift signal part 251 generates the power supply potential VGA, generates the shift signals p1 and p2, and controls the shift part 120 of the light-emitting array 100. The power supply/shift signal part 251 includes buffers Buf1 and Buf2, and a power supply VS1. The power supply/shift signal part 251 generates the shift signals p1 and p2. The buffer Buf1 supplies the shift signal p1 to the φ1 terminal of the light-emitting array 100. The buffer Buf2 supplies the shift signal p2 to the φ2 terminal of the light-emitting array 100. The power supply VS1 generates the power supply potential VGA and supplies the power supply potential VGA to the VGA terminal of the light-emitting array 100. The power supply VS1 also serves as a power supply of the buffers Buf1 and Buf2. That is, the buffers Buf1 and Buf2 substantially output a voltage of the power supply VS1 when the shift signals p1 and p2 are at an H level, and substantially outputs the reference potential (ground potential GND (0 V)) when the shift signals p1 and p2 are at an L level. The power supply of the buffers Buf1 and Buf2 may be a power supply independent of the power supply potential VGA.

The reference part 252 supplies the ground potential GND (0 V) as the reference potential to the V$_{GND}$ terminal of the light-emitting array 100.

The light emission power supply part 253 includes a power supply VS2. The power supply VS2 generates the light emission potential V$_{LD}$ and supplies the light emission potential V$_{LD}$ to the V$_{LD}$ terminal of the light-emitting array 100.

Although the power supply/shift signal part 251 generates the shift signals p1 and p2, such signals may be received from the measurement control unit 2. The control unit 250 and the measurement control unit 2 may be combined as a control unit.

Figure 6:
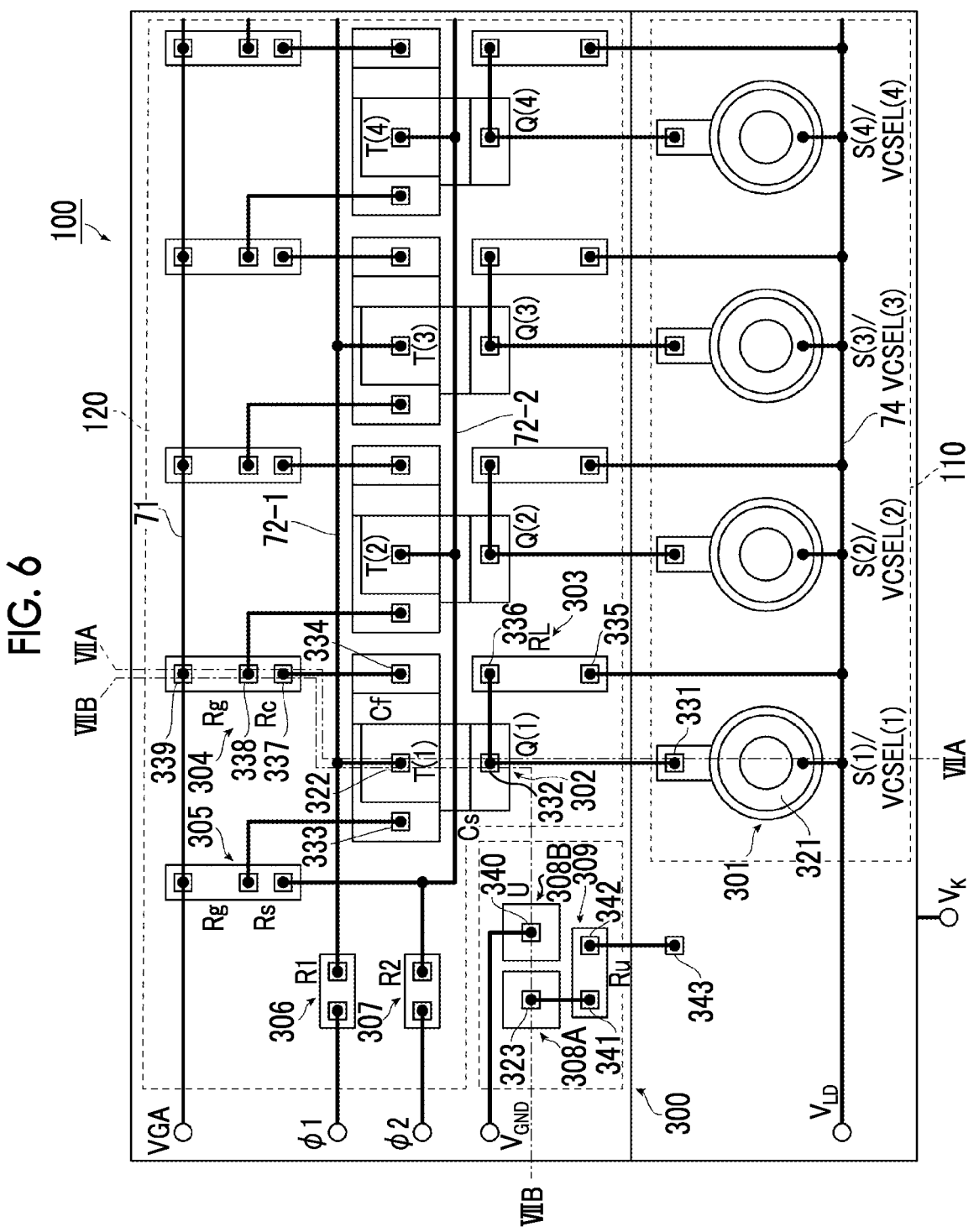
FIG. 6 is a diagram illustrating an example of a planar layout of the light-emitting array.

Planar Layout and Cross-Sectional structure of Light-Emitting Array 100 FIG. 6 is a diagram illustrating an example of a planar layout of the light-emitting array 100. FIG. 6 shows the planar layout focusing on the shift thyristors T(1) to T(4), the coupling transistors Q(1) to Q(4), the light emission control thyristors S(1) to S(4), and the VCSEL(1) to VCSEL(4).

Figure 7A:
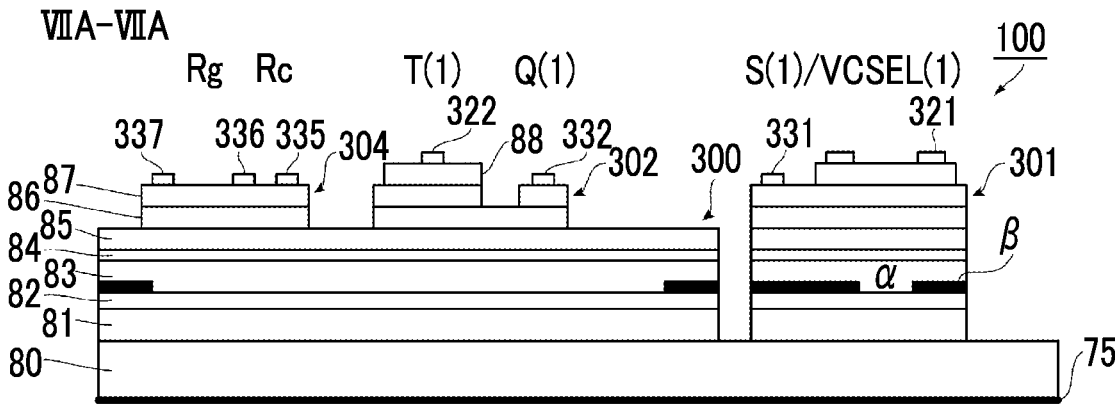
FIGS. 7A and 7B are diagrams illustrating an example of a cross section of the light-emitting array, and specifically.
Figure 7B:
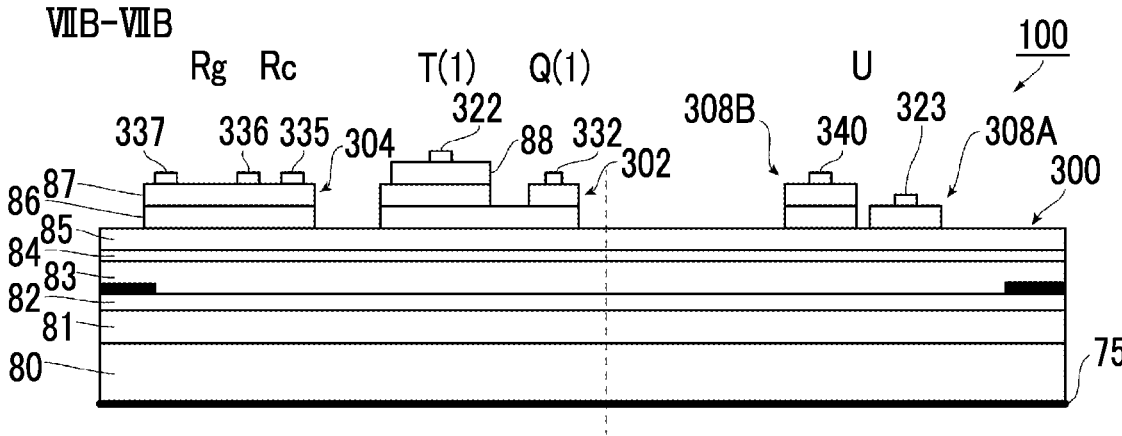

As shown in FIGS. 7A and 7B described below, the light-emitting array 100 is configured by an n-type semiconductor layer 81, an active layer 82, the p-type semiconductor layer 83, the tunnel junction layer 84, the n-type semiconductor layer 85, a p-type semiconductor layer 86, an n-type semiconductor layer 87, and a p-type semiconductor layer 88 laminated on the n-type semiconductor substrate 80. Then, the shift thyristors T, the coupling transistors Q, the light emission control thyristors S, the VCSELs, the disconnection thyristors U, the resistors Ru, and the like are configured as a plurality of separated islands as the semiconductor layers are partially removed by etching. The island may be denoted as mesa, and etching for forming the island (mesa) may be denoted as mesa etching.

The light-emitting array 100 includes an island 300 in which the shift part 120 and the disconnection part 130 are provided, and an island 301 in which the light emission control thyristor S(1) and the VCSEL(1) are provided.

Then, the light-emitting array 100 includes, on the island 300, an island 302 in which the shift thyristor T(1) and the coupling transistor Q(1) are provided, an island 303 in which the current-limiting resistor RL is provided, an island 304 in which the coupling resistor Rc and the power supply line resistor Rg are provided, an island 305 in which the start resistor Rs and the power supply line resistor Rg are provided, islands 306 and 307 in which the current-limiting resistors R1 and R2 are provided, an island 308 (islands 308A and 308B) in which the disconnection thyristor U is provided, and an island 309 in which the resistor Ru is provided.

FIGS. 7A and 7B are diagrams illustrating an example of a cross section of the light-emitting array 100. FIG. 7A is a cross section taken along the line VIIA-VIIA of FIG. 6, and FIG. 7B is a cross section taken along the line VIIB-VIIB of FIG. 6. In the cross section VIIA-VIIA shown in FIG. 7A, the light emission control thyristor S(1), the VCSEL(1), the shift thyristor T(1), the coupling transistor Q(1), the coupling resistor Rc, and the power supply line resistor Rg are shown. In the cross section VIIB-VIIB shown in FIG. 7B, the cross section of the shift thyristor T(1), the coupling transistor Q(1), the coupling resistor Rc, the power supply line resistor Rg, and the disconnection thyristor U are shown. In FIGS. 7A and 7B, the portions of the shift thyristor T(1), the coupling transistor Q(1), the coupling resistor Rc, and the power supply line resistor Rg are common.

In the following description, the islands of the light-emitting array 100 of FIG. 6 will be described referring to FIGS. 7A and 7B.

As described above, the light-emitting array 100 is configured by the n-type semiconductor layer 81, the active layer 82, the p-type semiconductor layer 83, the tunnel junction layer 84, the n-type semiconductor layer 85, the p-type semiconductor layer 86, the n-type semiconductor layer 87, and the p-type semiconductor layer 88 laminated on the n-type semiconductor substrate 80.

The island 300 is an island in which the shift part 120 is provided, and is a portion where the n-type semiconductor layer 81, the active layer 82, the p-type semiconductor layer 83, the tunnel junction layer 84, the n-type semiconductor layer 85 on the n-type semiconductor substrate 80 remain without being removed.

As shown in FIG. 7A, the VCSEL(1) and the light emission control thyristor S(1) are laminated and provided in the island 301. In the surroundings of the island 301, the n-type semiconductor layer 81, the active layer 82, the p-type semiconductor layer 83, the tunnel junction layer 84, the n-type semiconductor layer 85, the p-type semiconductor layer 86, the n-type semiconductor layer 87, and the p-type semiconductor layer 88 are removed by etching. The p-ohmic electrode 321 that easily forms an ohmic contact with the p-type semiconductor layer is provided on the p-type semiconductor layer 88. An n-ohmic electrode 331 that easily forms ohmic contact with the n-type semiconductor layer is provided on the n-type semiconductor layer 87 exposed by partially removing the p-type semiconductor layer 88. The VCSEL(1) has the n-type semiconductor layer 81 as a cathode K (see FIG. 5), the active layer 82 as an active layer, and the p-type semiconductor layer 83 as an anode A (see FIG. 5). The light emission control thyristor S(1) has the n-type semiconductor layer 85 as a cathode K, the p-type semiconductor layer 86 as a p-gate Gp (a p-gate layer), the n-type semiconductor layer 87 as an n-gate Gn (an n-gate layer), and the p-type semiconductor layer 88 as an anode A. The n-ohmic electrode 331 is the n-gate Gn of the light emission control thyristor S(1).

That is, as shown in FIG. 7A, the VCSEL(1) is provided on the n-type semiconductor substrate 80, and the light emission control thyristor S(1) is laminated on the VCSEL (1) with the tunnel junction layer 84 interposed therebetween. The tunnel junction layer 84 suppresses impediment of current flow caused by a reverse bias between the p-type semiconductor layer 83 of the VCSEL(1) and the n-type semiconductor layer 85 of the light emission control thyristor S(1). The tunnel junction layer 84 is a junction of an n⁺⁺ layer doped with an n-type impurity at a high concentration and a p⁺⁺ layer doped with a p-type impurity at a high concentration, and a current flows in the tunnel junction layer 84 by a tunnel effect even in a reverse bias state. Accordingly, the p-type semiconductor layer 83 and the n-type semiconductor layer 85 are at the same potential.

The island 301 has a columnar shape, except for a portion where the n-ohmic electrode 331 is provided. The p-ohmic electrode 321 is provided in an annular shape on the p-type semiconductor layer 88 of the columnar island 301. Then, a layer of a part of the p-type semiconductor layer 83 (configured with a plurality of semiconductor layers) exposed by etching is oxidized from a columnar outer peripheral portion to form a current blocking portion β where current flow is impeded, in an annular shape. On the other hand, an unoxidized center portion forms a current passing portion α where current flow is facilitated. Then, light is emitted from the center portion of the annular p-ohmic electrode 321. The current blocking portion β is configured by providing an AlAs layer or an AlGaAs layer having a high Al concentration in a part of a plurality of semiconductor layers that configure the p-type semiconductor layer 83 and oxidizing the AlAs layer or the AlGaAs layer from the exposed outer peripheral portion to oxidize Al. In a peripheral portion of the VCSEL(1), there are many defects caused by etching, and non-light-emitting recombination easily occurs. Accordingly, the current blocking portion β is provided to suppress power to be consumed in non-light-emitting recombination. The current blocking portion β is provided to achieve low power consumption and improvement of light extraction efficiency. The light extraction efficiency is an amount of light that can be extracted per power.

Light of the VCSEL(1) is transmitted through the light emission control thyristor S(1) and emitted. In the light emission control thyristor S(1) (tunnel junction layer 84, n-type semiconductor layer 85, p-type semiconductor layer 86, n-type semiconductor layer 87, and p-type semiconductor layer 88), a portion through which light is transmitted may be removed. In this case, the light emission control thyristor S(1) has a cylindrical shape. With this configuration, a decrease in the amount of light due to absorption of light emitted from the VCSEL(1) in the light emission control thyristor S(1) is suppressed.

The shift thyristor T(1) and the coupling transistor Q(1) are provided in the island 302. In the surroundings of the island 302, the p-type semiconductor layer 86, the n-type semiconductor layer 87, and the p-type semiconductor layer 88 are removed by etching (see FIG. 7A). A p-ohmic electrode 322 is provided on the p-type semiconductor layer 88. The p-ohmic electrode 322 is an electrode (anode A electrode) of the anode A of the shift thyristor T(1), and is connected to the shift signal line 72-1 to which the shift signal p1(φ1) is supplied. n-ohmic electrodes 332, 333, and 334 are provided on the n-type semiconductor layer 87 exposed by removing the p-type semiconductor layer 88 (in FIG. 7A, the n-ohmic electrode 332 is shown). The n-ohmic electrodes 332 and 334 are electrodes (collectors Cf and Cs electrodes) of the collectors Cs and Cf of the coupling transistor Q(1). The n-type semiconductor layer 87 is removed between the p-ohmic electrode 322 and the n-ohmic electrodes 332 and 334 (see FIG. 7A). The n-ohmic electrode 333 is an electrode (an n-gate Gn electrode) of the n-gate Gn of the shift thyristor T(1).

In the island 303, the current-limiting resistor RL is provided. The configuration of the island 303 is the same as the configuration of the island 304 (see FIG. 7A) described below. That is, in the surroundings of the island 303, the p-type semiconductor layer 86, the n-type semiconductor layer 87, and the p-type semiconductor layer 88 are removed by etching. In the island 303, the p-type semiconductor layer 88 is removed by etching. Two n-ohmic electrodes 335 and 336 are provided on the exposed n-type semiconductor layer 87. The n-type semiconductor layer 87 between the n-ohmic electrodes 335 and 336 is the current-limiting resistor RL.

In the island 304, the coupling resistor Rc and the power supply line resistor Rg are provided. In the surroundings of the island 304, the p-type semiconductor layer 86, the n-type semiconductor layer 87, and the p-type semiconductor layer 88 are removed by etching. In addition, in the island 304, the p-type semiconductor layer 88 is removed by etching. Three n-ohmic electrodes 337, 338, and 339 are provided on the exposed n-type semiconductor layer 87. Then, the n-type semiconductor layer 87 between the n-ohmic electrodes 337 and 338 is the coupling resistor Rc, and the n-type semiconductor layer 87 between the n-ohmic electrodes 338 and 339 is the power supply line resistor Rg.

In the island 305, the start resistor Rs and the power supply line resistor Rg are provided. The configuration of the island 305 is the same as the configuration of the island 304.

In the islands 306 and 307, the current-limiting resistors R1 and R2 are provided, respectively. The configurations of the islands 306 and 307 are the same as the configuration of the island 304.

In the island 308 (islands 308A and 308B), the disconnection thyristor U of the disconnection part 130 is provided. In the surroundings of the island 308 (islands 308A and 308B), the p-type semiconductor layer 88, the n-type semiconductor layer 87, and the p-type semiconductor layer 86 are removed by etching. In addition, in the island 308A, the p-type semiconductor layer 88 and the n-type semiconductor layer 87 are removed by etching. Then, a p-ohmic electrode 323 is provided on the exposed p-type semiconductor layer 86. In the island 308B, the p-type semiconductor layer 88 is removed by etching. Then, an n-ohmic electrode 340 is provided on the exposed n-type semiconductor layer 87. The disconnection thyristor U has the p-type semiconductor layer 86 of the island 308A as an anode A, the n-type semiconductor layer 85 as an n-gate Gn, the p-type semiconductor layer 86 of the island 308B as a p-gate Gp, and the n-type semiconductor layer 87 as a cathode K. That is, the p-ohmic electrode 323 of the island 308A is an anode A electrode, and the n-ohmic electrode 340 of the island 308B is a cathode K electrode.

In the island 309, the resistor Ru of the disconnection part 130 is provided. The island 309 is configured in the same manner as the island 304. Then, n-ohmic electrodes 341 and 342 are provided on the exposed n-type semiconductor layer 87 (see FIG. 6). The n-type semiconductor layer 87 between the n-ohmic electrodes 341 and 342 is the resistor Ru.

An n-ohmic electrode 343 is provided on the exposed n-type semiconductor substrate 80. The substrate electrode 75 is provided on a rear surface of the n-type semiconductor substrate 80. As described above, the substrate electrode 75 is the $V_K$ terminal. A voltage of the $V_K$ terminal is the substrate potential $V_K$.

In the above description, although the VCSEL(1), the shift thyristor T(1), and the coupling transistor Q(1) have been described, the same also applies to other VCSELs, shift thyristors T, and coupling transistors Q.

Next, a connection relationship will be described. In FIG. 6, wiring lines (power supply line 71, shift signal lines 72-1 and 72-2, and light emission potential line 74) that are used for connection are indicated by straight lines.

The p-ohmic electrode 321 that is the anode A electrode of the light emission control thyristor S(1) of the island 301 is connected to the light emission potential line 74. The light emission potential line 74 is connected to the $V_{LD}$ terminal to which the light emission potential $V_{LD}$ is supplied.

The n-ohmic electrode 331 that is the n-gate Gn electrode of the light emission control thyristor S(1) of the island 301 is connected to the n-ohmic electrode 332 that is the collector Cs electrode of the coupling transistor Q(1) of the island 302. The n-ohmic electrode 332 is connected to the n-ohmic electrode 336 of the current-limiting resistor RL of the island 303. The n-ohmic electrode 335 of the island 303 is connected to the light emission potential line 74.

The p-ohmic electrode 322 that is the anode A electrode of the shift thyristor T(1) of the island 302 is connected to the shift signal line 72-1. The shift signal line 72-1 is connected to the φ1 terminal, to which the shift signal p1 is supplied, via the current-limiting resistor R1 provided in the island 306. The n-ohmic electrode 333 that is the n-gate Gn electrode of the shift thyristor T(1) of the island 302 is connected to the n-ohmic electrode (no reference numeral) that is a connection point of the start resistor Rs and the power supply line resistor Rg provided in the island 305. The n-ohmic electrode 334 that is the collector Cf electrode of the coupling transistor Q(1) of the island 302 is connected to one n-ohmic electrode 337 of the coupling resistor Rc of the island 304.

The other n-ohmic electrode 338 of the coupling resistor Rc of the island 304 is connected to the n-ohmic electrode (no reference numeral) that is the n-gate Gn electrode of the shift thyristor T(2). The n-ohmic electrode 339 that is the other electrode of the power supply line resistor Rg of the island 304 is connected to the power supply line 71. The power supply line 71 is connected to the VGA terminal to which the power supply potential VGA is supplied.

One n-ohmic electrode (no reference numeral) of the start resistor Rs of the island 305 is connected to the shift signal line 72-2. The other n-ohmic electrode (no reference numeral) of the power supply line resistor Rg of the island 305 is connected to the power supply line 71. The shift signal line 72-2 is connected to the φ2 terminal, to which the shift signal p2(φ2) is supplied, via the current-limiting resistor R2 provided in the island 307.

The shift signal line 72-1 is connected to the p-ohmic electrode (for example, the p-ohmic electrode 322 of the island 302) that is the anode A electrode of the odd-numbered shift thyristor T, and the shift signal line 72-2 is connected to the p-ohmic electrode that is the anode A electrode of the even-numbered shift thyristor T. The shift signal line 72-1 is connected to one n-ohmic electrode (no reference numeral) of the island 306 of the current-limiting resistor R1, and the other n-ohmic electrode (no reference numeral) of the island 306 is connected to the φ1 terminal. The shift signal line 72-2 is connected to one n-ohmic electrode (no reference numeral) of the island 307 of the current-limiting resistor R2, and the other n-ohmic electrode (no reference numeral) of the island 307 is connected to the φ2 terminal.

The p-ohmic electrode 323 of the island 308A is connected to the n-ohmic electrode 341 of the island 309. The n-ohmic electrode 340 of the island 308B is connected to the V$_{GND}$ terminal to which the ground potential GND as the reference potential is supplied.

The n-ohmic electrode 342 of the island 309 is connected to the n-ohmic electrode 343 provided on the n-type semiconductor substrate 80.

As shown in FIGS. 6 and 7A, the shift thyristor T(1), the coupling transistor Q(1), the coupling resistor Rc, and the power supply line resistor Rg are provided on the island 300. As shown in FIGS. 6 and 7B, the disconnection thyristor U of the disconnection part 130 is provided on the island 300.

The island 300 has a semiconductor layer laminate (n-type semiconductor layer 81, active layer 82, and p-type semiconductor layer 83). As shown in FIG. 7A, the semiconductor layer laminate (n-type semiconductor layer 81, active layer 82, and p-type semiconductor layer 83) is a semiconductor layer laminate that configures a VCSEL. Note that, in the shift part 120, a semiconductor layer laminate (n-type semiconductor layer 81, active layer 82, and p-type semiconductor layer 83) is not made to function as a VCSEL. that is, the semiconductor layer laminate (n-type semiconductor layer 81, active layer 82, and p-type semiconductor layer 83) that configure the VCSEL is not removed, and the n-type semiconductor layer 85, the p-type semiconductor layer 86, the n-type semiconductor layer 87, and the p-type semiconductor layer 88 are laminated via the tunnel junction layer 84, such that the shift part 120 and the disconnection part 130 are configured. With this, the shift thyristor T of the shift part 120 and the light emission control thyristor S of the light-emitting part 110 are configured with the same semiconductor layer laminate (n-type semiconductor layer 85, p-type semiconductor layer 86, n-type semiconductor layer 87, and p-type semiconductor layer 88). With this configuration, as described below, complication of a manufacturing process of the light-emitting array 100 is suppressed. Here, the semiconductor layer laminate (n-type semiconductor layer 81, active layer 82, and p-type semiconductor layer 83) where the shift part 120 and the disconnection part 130 are provided may be denoted as a structure equivalent to the VCSEL (light-emitting element).

As described above, the light-emitting array 100 is configured as one semiconductor component monolithically configured on one semiconductor substrate (n-type semiconductor substrate 80), and further, as one semiconductor chip.

In FIGS. 6 and 7A, although the p-ohmic electrode 321 is denoted in an annular shape, as shown in FIG. 6, the p-ohmic electrodes 321 are connected by the light emission potential line 74 between the light-emitting blocks 111 (see FIG. 5). Accordingly, the annular outer peripheral portions of the p-ohmic electrodes 321 may be connected and provided as an electrode that covers the front surface of the light-emitting part 110. The p-ohmic electrode 321 shown in FIG. 3 is configured in this manner.

Next, the operation of the light-emitting array 100 will be described.

First, the operation of a light-emitting array 100' shown as a comparative example will be described.

Figure 8:
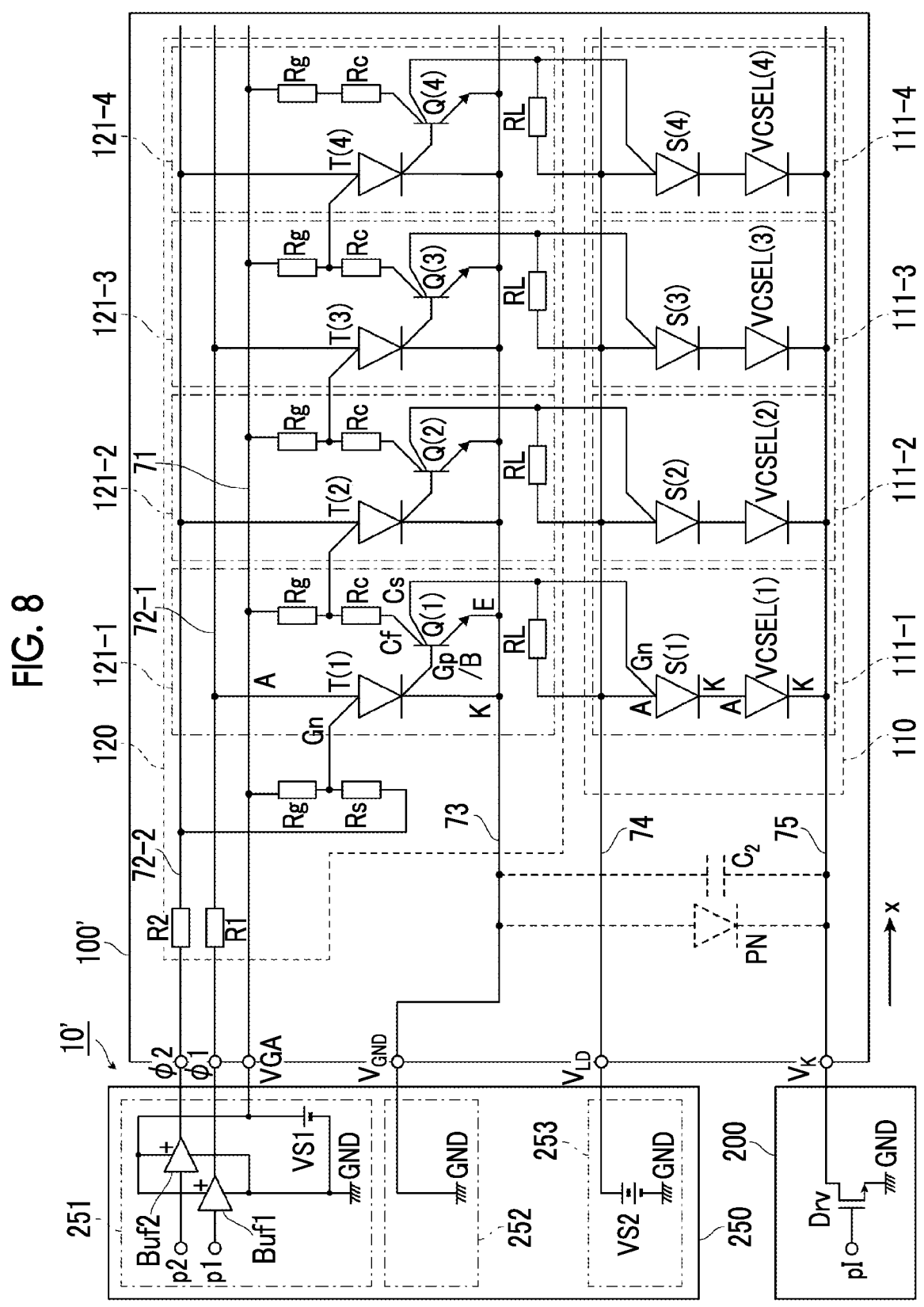
FIG. 8 is, as a comparative example, an equivalent circuit of a light-emitting device (a light-emitting device of the comparative example) using a light-emitting array (a light-emitting array of the comparative example) to which the present exemplary embodiment is not applied.

FIG. 8 is an equivalent circuit of a light-emitting device 10' (light-emitting device 10' of the comparative example) using the light-emitting array 100' (the light-emitting array 100' of the comparative example) shown as the comparative example, to which the present exemplary embodiment is not applied. The light-emitting device 10' includes a light-emitting array 100', a drive unit 200, and a control unit 250. The drive unit 200 and the control unit 250 are the same as the drive unit 200 and the control unit 250 in the light-emitting device 10 shown in FIG. 5.

The light-emitting device 10' includes the light-emitting array 100', instead of the light-emitting array 100 of the light-emitting device 10. The light-emitting array 100' does not include the disconnection part 130 that is provided in the light-emitting array 100. Then, the shift part reference potential line 73 is connected to the V$_{GND}$ terminal to which the ground potential GND as the reference potential is supplied. That is, the shift part reference potential line 73 is at the ground potential GND. Other configurations of the light-emitting array 100' are the same as the configurations of the light-emitting array 100 and are thus represented by the same reference numerals, and description thereof will not be repeated.

Operation of Shift Thyristor T, Coupling Transistor Q, VCSEL, and Light Emission Control Thyristor S Here, the basic operation of the light-emitting array 100' will be described.

Figure 9A:
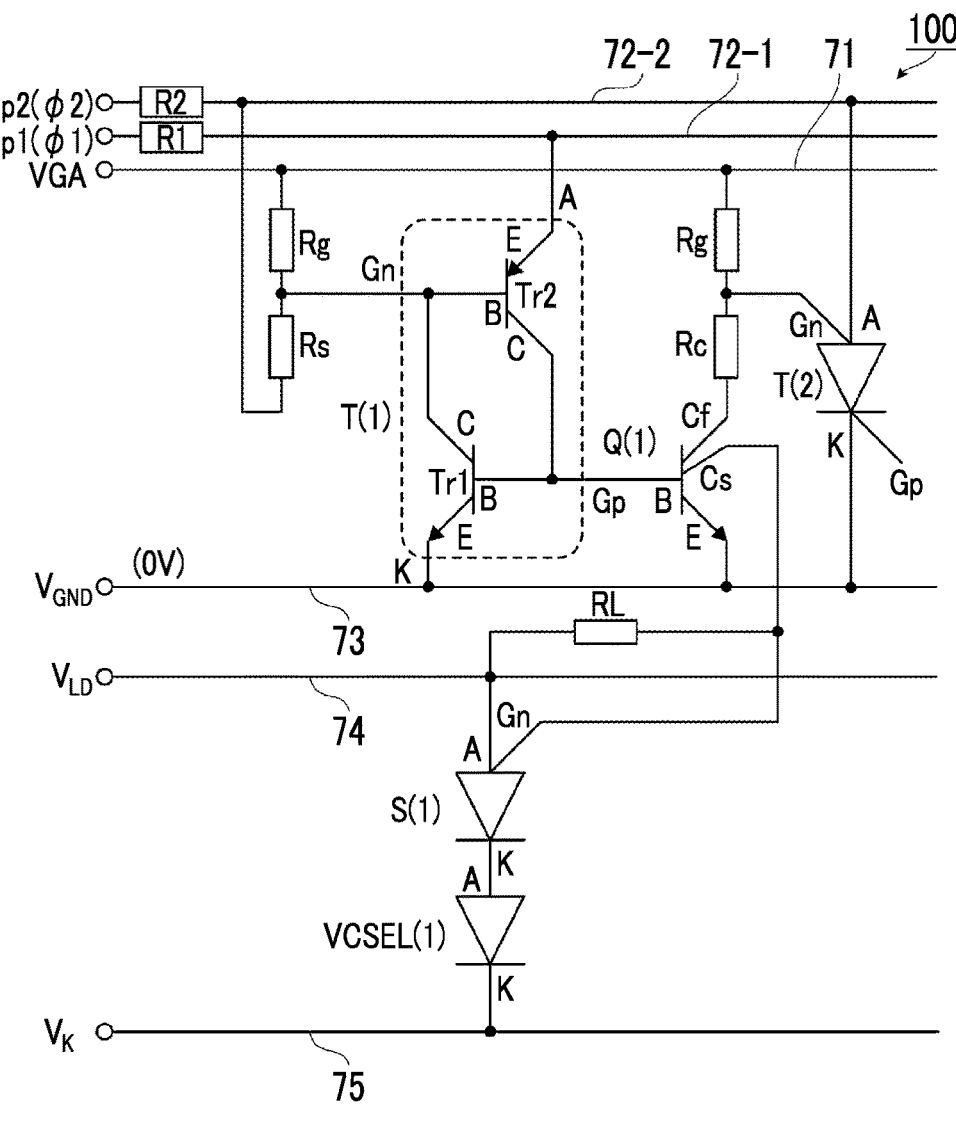
FIGS. 9A and 9B are diagrams illustrating a basic operation of the light-emitting array of the comparative example by a shift thyristor, a coupling transistor, a light emission control thyristor, and a VCSEL, and specifically.
Figure 9B:
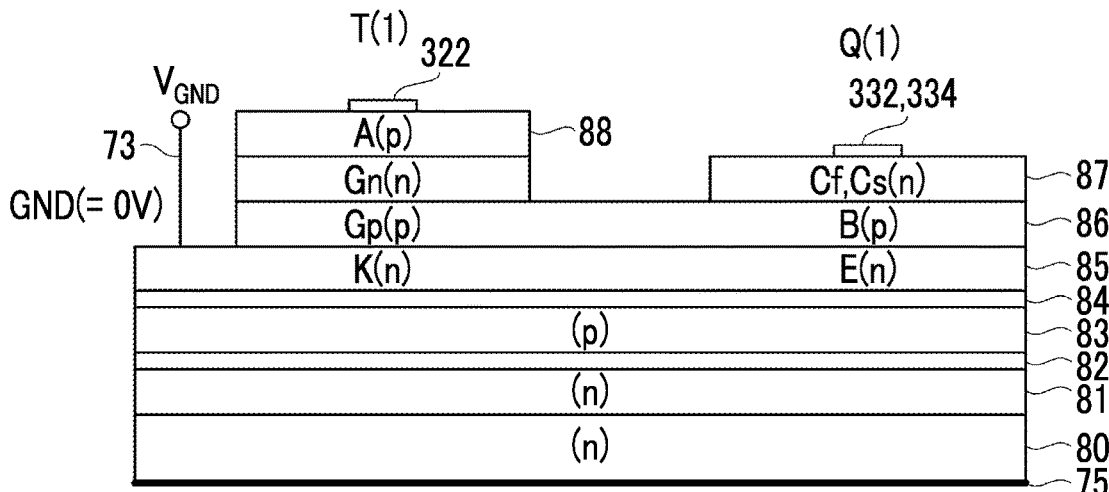

FIGS. 9A and 9B are diagrams illustrating the basic operation of the light-emitting array 100' of the comparative example by the shift thyristor T(1), the coupling transistor Q(1), the light emission control thyristor S(1), and the VCSEL(1). FIG. 9A is an equivalent circuit, and FIG. 9B is a cross section in portions of the shift thyristor T(1) and the coupling transistor Q(1). In FIG. 9A, the shift thyristor T(2) is indicated together.

The shift thyristor T, the coupling transistor Q, the light emission control thyristor S, and the VCSEL are configured with, for example, a group III-V compound semiconductor, such as GaAs. Here, a forward voltage (diffusion potential) Vd of a junction of the compound semiconductor is 1.5 V, and a saturation voltage Vsat of a bipolar transistor configured with the compound semiconductor is 0.3 V. The ground potential GND is 0 V, the power supply potential VGA is 5 V, and the light emission potential V$_{LD}$ is 7 V. The shift signals p1 and p2 and the light emission signal pI are signals that have 0 V ("L" (0 V)) at the L level and 5 V ("H" (5 V)) at the H level.

In FIG. 9A, the shift thyristor T(1) is indicated by a combination of an npn bipolar transistor Tr1 (hereinafter, denoted as an npn transistor Tr1) and a pnp bipolar transistor Tr2 (hereinafter, denoted as a pnp transistor Tr2). A base B of the npn transistor Tr1 is connected to a collector C of the pnp transistor Tr2, and a collector C of the npn transistor Tr1 is connected to a base B of the pnp transistor Tr2. An emitter E of the npn transistor Tr1 is the cathode K of the shift thyristor T(1), and an emitter E of the pnp transistor Tr2 is the anode A of the shift thyristor T(1). The collector C of the npn transistor Tr1 (the base B of the pnp transistor Tr2) is the n-gate Gn of the shift thyristor T(1), and the collector C (the base B of the npn transistor Tr1) of the pnp transistor Tr2 is the p-gate Gp of the shift thyristor T(1).

The npn transistor Tr1 in the shift thyristor T(1) and the coupling transistor Q(1) configure a current mirror circuit. That is, a current proportional to a current flowing in the npn transistor Tr1 flows in the coupling transistor Q(1).

As described above, the VCSEL(1) and the light emission control thyristor S(1) are connected in series. That is, the anode A of the VCSEL(1) and the cathode K of the light emission control thyristor S(1) are connected. The anode A of the light emission control thyristor S(1) is connected to the light emission potential line 74. The cathode K of the VCSEL(1) is connected to the substrate electrode 75. The substrate electrode 75 is the $V_K$ terminal and is connected to the driver Drv (see FIG. 5).

The anode A of the shift thyristor T(2) is connected to the shift signal line 72-2. The shift signal line 72-2 is connected to the φ2 terminal to which the shift signal p2 is supplied. In the following description, the shift signal p1(φ1) and the shift signal p2(φ2) may be denoted.

First, the operation of the shift thyristor T(1) in the shift part 120 will be described.

The power supply line 71 has the power supply potential VGA (5V), the shift part reference potential line 73 has the ground potential GND (0 V), the shift signals p1(φ1) and p2(φ2) are "L" (0 V) and the shift signal lines 72-1 and 72-2 have the ground potential GND (0 V), the light emission signal pI is "L" (0 V) and the driver Drv is off, and no potential is set to the substrate electrode 75. This state is denoted as an initial state.

In this case, the npn transistor Tr1 and the pnp transistor Tr2 that configure the shift thyristor T(1) are in an off state. The n-gate Gn of the shift thyristor T(1) is connected to a connection point of the start resistor Rs and the power supply line resistor Rg connected in series. Then, the other end (an end opposite to the connection point) of the start resistor Rs is connected to the shift signal line 72-2 of "L" (0V), and the other end (an end opposite to the connection point) of the power supply line resistor Rg is connected to the power supply line 71 of 5 V. Accordingly, the n-gate Gn becomes a voltage obtained by dividing a voltage difference (5V) by the start resistor Rs and the power supply line resistor Rg. In a case where a resistance ratio of the start resistor Rs and the power supply line resistor Rg is 1:5 as an example, the n-gate Gn becomes 0.83 V.

Here, in a case where the shift signal p1(φ1) is shifted from "L" (0 V) to "H" (5 V), a voltage difference between the emitter E (anode A) ("H" (5 V)) and the base B (p-gate Gp) (0.83 V) of the pnp transistor Tr2 of the shift thyristor T(1) is 4.17 V and is equal to or greater than the forward voltage Vd (1.5 V). With this, a forward bias occurs between the emitter E and the base B, and the pnp transistor Tr2 is shifted from an off state to an on state. Then, the collector C of the pnp transistor Tr2 (the base B of the npn transistor TO) becomes 4.7 V obtained by subtracting the saturation voltage Vsat (0.3 V) from the emitter E ("H" (5 V)) and is equal to or greater than the forward voltage Vd (1.5 V). With this, a forward bias occurs between the emitter E and the base B, and the npn transistor Tr1 is shifted from an off state to an on state. Since the npn transistor Tr1 and the pnp transistor Tr2 in the shift thyristor T(1) enter the on state, the shift thyristor T(1) is shifted from an off state to an on state. The shifting of the shift thyristor T from the off state to the on state is denoted as turn-on. The shifting of the shift thyristor T from the on state to the off state is denoted as turn-off.

That is, in the initial state, in a case where the shift signal p1(φ1) is shifted from "L" (0 V) to "H" (5 V), the shift thyristor T(1) is turned on and is shifted from the off state to the on state. Here, the state of the shift thyristor T that is turned on in a case where the anode A becomes the "H" (5 V) is denoted as a state capable of being shifted to the on state. The same also applies to other cases.

In a case where the shift thyristor T(1) is turned on, the n-gate Gn in the shift thyristor T(1) becomes the saturation voltage Vsat of 0.3 V. The anode A becomes a voltage that is determined by a voltage (Vd+Vsat) obtained by adding the forward voltage Vd and the saturation voltage Vsat and a voltage drop in internal resistance of the shift thyristor T.

Here, it is assumed that the anode A becomes 1.9 V. That is, in a case where the shift thyristor T(1) is turned on, the shift signal line 72-1 is shifted from 5 V to 1.9 V. Then, the p-gate Gp of the shift thyristor T(1) becomes 1.6 V.

As described above, the shift thyristor T(1) is turned on in a case where the potential of the n-gate Gn becomes a potential lower than the potential of the anode A by the forward voltage Vd (1.5 V) or more. The shift thyristor T(1) is turned off in a case where the potential (the potential between the anode A and the cathode K) of the shift signal line 72-1 is less than 1.9 V described above. For example, in a case where the anode A becomes "L" (0 V), a potential difference between the anode A and the cathode K becomes 0 V, and the shift thyristor T(1) is turned off. On the other hand, in a case where the voltage (the potential difference between the anode A and the cathode K) of the shift signal line 72-1 is equal to or greater than 1.9 V, the on state of the shift thyristor T(1) is held. Accordingly, 1.9 V is denoted as a holding voltage. Even though the holding voltage is applied, in a case where a current for holding the on state of the shift thyristor T(1) does not flow, the on state of the shift thyristor T(1) is not held. The current for holding the on state is denoted as a holding current.

Next, the operation of the coupling transistor Q(1) will be described.

In the initial state, the npn transistor Tr1 of the shift thyristor T(1) is in the off state. Accordingly, the coupling transistor Q(1) is also in the off state. In this case, the emitter E of the coupling transistor Q(1) is connected to the shift part reference potential line 73 of the ground potential GND (0 V). The collector Cf of the coupling transistor Q(1) becomes the power supply potential VGA (5 V) via the power supply line resistor Rg and the coupling resistor Re connected in series. The collector Cs becomes the light emission potential $V_{LD}$ (7 V) via the current-limiting resistor RL.

As described above, in a case where the shift thyristor T(1) is turned on, the shift signal line 72-1 becomes 1.9 V. Then, the p-gate Gp of the shift thyristor T(1) becomes 1.6 V. Since the base B of the coupling transistor Q(1) is connected to the p-gate Gp of the shift thyristor T(1), the emitter E and the base B of the coupling transistor Q(1) become equal to or greater than the forward voltage Vd (1.5 V), that is, a forward bias occurs therebetween. With this, the coupling transistor Q(1) is shifted from the on state to the off state. Then, the collector Cf becomes the saturation voltage Vsat (0.3 V) (the collector Cs will be described below). The connection point (the n-gate Gn of the shift thyristor T(2)) of the power supply line resistor Rg and the coupling resistor Rc becomes a voltage obtained by dividing the voltage difference (4.7 V) between the voltage (5 V) of the power supply line 71 and the voltage (0.3 V) of the collector Cf by the power supply line resistor Rg and the coupling resistor Rc. In a case where a resistance ratio of the power supply line resistor Rg and the coupling resistor Rc is 5:1 as an example, the connection point (the n-gate Gn of the shift thyristor T(2)) of the power supply line resistor Rg and the coupling resistor Rc becomes 1.08 V.

The anode A of the shift thyristor T(2) is connected to the shift signal line 72-2. Since the shift signal p2(φ2) is "L" (0 V), the shift thyristor T(2) is not turned on. Note that, in a case where the shift signal p2(φ2) is shifted from "L" (0 V) to "H" (5 V), the anode A of the shift thyristor T(2) connected to the shift signal line 72-2 becomes "H" (5 V). Then, in the shift thyristor T(2), a potential difference (3.92 V) between the anode A and the n-gate Gn (1.08 V) is equal to or greater than the forward voltage Vd (1.5 V) and a forward bias occurs therebetween, and the shift thyristor T(2) is turned on. In this case, both the shift thyristor T(1) and the shift thyristor T(2) are in the on state. Next, in a case where the shift signal p1(φ1) is shifted from "H" (5 V) to "L" (0 V), the anode A of the shift thyristor T(1) becomes the ground potential GND (0 V), and the shift thyristor T(1) is turned off.

As described above, in the initial state, in a case where the shift signal p1(φ1) is shifted from "L" (0 V) to "H" (5 V), the shift thyristor T(1) is turned on. In a period during which the shift signal p1(φ1) is "H" (5 V), in a case where the shift signal p2(φ2) is shifted from "L" (0 V) to "H" (5 V), the shift thyristor T(2) is turned on. Thereafter, in a case where the shift signal p1(φ1) is shifted from "H" (5 V) to "L" (0 V), the shift thyristor T(1) is turned off. Though not shown in FIG. 9A, in a period during which the shift signal p2(φ2) is "H" (5 V), in a case where the shift signal p1(φ1) is shifted from "L" (0 V) to "H" (5 V), the shift thyristor T(3) is turned on. Thereafter, in a case where the shift signal p2(φ2) is shifted from "H" (5 V) to "L" (0 V), the shift thyristor T(2) is turned off.

That is, in the shift thyristor T, the shift signals p1(φ1) and p2(φ2) are alternately switched between "L" (0 V) and "H" (5 V) while providing a period during which both the shift signals p1(φ1) and p2(φ2) are "H" (5 V), whereby the on state of the shift thyristor T is shifted. In this way, there are a plurality of elements, and an operation in which an element to be turned on among a plurality of elements is shifted individually is a shift operation. In the exemplary embodiment in the present specification, an element that is forced to be turned on or off by the shift operation is a shift element. In a case where an order of the arrangement of the elements and an order of the shift operation are the same, since a distance is close, it is advantageous for wiring and the like. Note that the order of the arrangement of the elements and the order of the shift operation may not be always the same.

As described above, the operation of the shift part 120 requires that the shift part reference potential line 73 is at the ground potential GND (0 V) of the reference potential.

Next, the operation of the light emission control thyristor S(1) and the VCSEL(1) will be described.

The collector Cs of the coupling transistor Q(1) is connected to the n-gate Gn of the light emission control thyristor S(1). Accordingly, in a case where the coupling transistor Q(1) is shifted from the off state to the on state, similarly to the collector Cs of the coupling transistor Q(1), the potential of the n-gate Gn of the light emission control thyristor S(1) connected to the collector Cs becomes 0.3 V. The anode A of the light emission control thyristor S(1) is connected to the light emission potential line 74. The light emission potential line 74 is connected to the $V_{LD}$ terminal, and is supplied with the light emission potential $V_{LD}$ (7 V). Accordingly, the voltage between the anode A and the n-gate Gn of the light emission control thyristor S(1) becomes 6.7 V, and a forward bias occurs in the pn junction between the anode A and the n-gate Gn of the light emission control thyristor S(1). Then, the collector Cs of the coupling transistor Q(1) draws a current from the light emission potential $V_{LD}$(7 V) via the pn junction between the anode A and the n-gate Gn of the light emission control thyristor S(1). With this, the collector Cs of the coupling transistor Q(1) becomes 5.5 V obtained by subtracting the forward voltage Vd (1.5 V) from the light emission potential $V_{LD}$ (7 V). Here, in a case where the driver Drv is turned on, the $V_K$ terminal (substrate electrode 75) changes toward the ground potential GND (0 V). Then, the substrate electrode 75, that is, the cathode K of the VCSEL(1) changes toward 0 V. With this, the light emission control thyristor S(1) is turned on, and a current flows in the light emission control thyristor S(1) and the VCSEL(1) connected in series, such that the VCSEL(1) emits light.

That is, in a state in which the coupling transistor Q(1) enters the on state, and the n-gate Gn of the light emission control thyristor S(1) becomes 5.5 V, in a case where the driver Dry is switched from off to on, the light emission control thyristor S(1) is turned on, and the VCSEL(1) emits light. Accordingly, the state in which the coupling transistor Q(1) enters the on state, and a forward bias (5.5 V) occurs between the anode A and the n-gate Gn of the light emission control thyristor S(1) is denoted as a state in which the VCSEL(1) can emit light. The light emission control thyristor S is denoted as a light emission control thyristor since the light emission control thyristor S controls the light emission of the VCSEL depending on the potential of the n-gate Gn.

In a case where the driver Drv is switched from on to off, the light emission current that is flowing in the light emission control thyristor S(1) and the VCSEL(1) is cut off, and the VCSEL(1) is quenched.

As described above, in a case where the coupling transistor Q is in the on state, and in a case where the driver Drv is switched from off to on, the VCSEL connected in series to the light emission control thyristor S connected to the coupling transistor Q emits light. That is, a case where the coupling transistor Q is in the on state is a case where the shift thyristor T connected to the coupling transistor Q is in the on state. Accordingly, the VCSEL to be made to emit light is selected by the shift thyristor T. Then, the on state of the shift thyristor T is shifted, whereby the VCSEL to be made to emit light, that is, the light-emitting block 111 is selected. In a case where the VCSELs (light-emitting blocks 111) are selected in order and are made to emit light, this corresponds to the sequential lighting method shown in FIG. 4A.

In a case where the shift thyristor T(1) is shifted from the on state to the off state, the coupling transistor Q(1) is shifted from the on state to the off state. That is, the collector Cs of the coupling transistor Q(1) can maintain 5.5 V. The n-gate Gn of the light emission control thyristor S(1) is connected to the light emission potential line 74 of the light emission potential $V_{LD}$ (7 V) via the current-limiting resistor RL. For this reason, the n-gate Gn of the light emission control thyristor S(1) increases toward the light emission potential $V_{LD}$ (7 V). In this case, parasitic capacitance Cag (capacitance is referred to as Cag) between the anode and the n-gate Gn of the light emission control thyristor S(1) is discharged by a time constant of RL×Cag via the current-limiting resistor RL (resistance value is referred to as RL). On the other hand, since electric charge accumulated in each of parasitic capacitance Cgg between the n-gate Gn and the p-gate Gp and parasitic capacitance Cg between the p-gate Gp and the cathode K in the light emission control thyristor S(1), and parasitic capacitance Cv in the VCSEL(1) cannot be moved, the potentials of the p-gate Gp and the cathode K of the light emission control thyristor S(1) increase by an increase amount of the potential of the n-gate Gn.

Here, in a case where the light emission signal pI is switched from "L" (0 V) to "H" (5 V), and the driver Drv is switched from off to on again, the substrate potential $V_K$ quickly changes toward the ground potential GND (0 V). That is, the cathode K of the VCSEL(1) connected to the substrate electrode 75 quickly changes toward the ground potential GND (0 V). In this case, a displacement current that passes through the parasitic capacitance Cag, Cgg, and Cgk flows, the light emission control thyristor S(1) is turned on with the displacement current as a threshold current, and the VCSEL(1) is lighted. That is, in a case where the VCSEL(1) is lighted once, even though the shift thyristor T(1) is not in the on state, the VCSEL(1) is lighted again in a case where the driver Drv is turned on again. Subsequently, the VCSEL(1) can repeatedly perform lighting and quenching. That is, the VCSEL(1) continuously generates a plurality of light emission pulses. In a case where the increase of the potential of the cathode K of the light emission control thyristor S(1) is small and is close to the ground potential GND, even though the driver Drv is turned on again, the light emission control thyristor S(1) is not turned on.

The above-described state occurs even in a case where the shift part 120 stops operation, that is, is off, in addition to a case where the shift thyristor T(1) is shifted from the on state to the off state. As described below, the shift part reference potential line 73 is shifted from a state of being connected to the ground potential GND to a state of being disconnected from the ground potential GND, the shift part 120 stops operation. Note that, in a case where the VCSEL(1) is lighted once, even subsequently, the VCSEL(1) can repeatedly perform lighting and quenching. That is, the VCSEL(1) continuously generates a plurality of light emission pulses. Bringing the VCSEL into a state capable of emitting light again is denoted as exhibiting a memory effect. Here, although the VCSEL(1) has been described, the same applies to other VCSELs.

As described above, the shift part reference potential line 73 is connected to the cathode K of the shift thyristor T and the emitter E of the coupling transistor Q. Accordingly, in a case of operating the shift part 120, the shift part reference potential line 73 needs to be set to a predetermined potential (here, the ground potential GND (0 V)). Note that, after the VCSEL selected by the shift part 120 is lighted once, the shift part reference potential line 73 does not need to be set to the ground potential GND (0 V).

As shown in FIG. 9B, the shift thyristor T(1) has the n-type semiconductor layer 85 as the cathode K, the p-type semiconductor layer 86 as the p-gate Gp, the n-type semiconductor layer 87 as the n-gate Gn, and the p-type semiconductor layer 88 as the anode A. The coupling transistor Q(1) has the n-type semiconductor layer 85 as the emitter E, the p-type semiconductor layer 86 as the base B, and the n-type semiconductor layer 87 as the collectors Cf and Cs. Then, the cathode K of the shift thyristor T(1) and the emitter E of the coupling transistor Q(1) are connected via the n-type semiconductor layer 85. The p-gate Gp of the shift thyristor T(1) and the base B of the coupling transistor Q(1) are connected via the p-type semiconductor layer 86. The n-gate Gn of the shift thyristor T(1) and the collectors Cf and Cs of the coupling transistor Q(1) are not connected while the n-type semiconductor layer 87 is removed.

Then, the n-type semiconductor layer 85 becomes the shift part reference potential line 73. That is, the cathode K of the shift thyristor T(1) and the emitter E of the coupling transistor Q(1) configured by the n-type semiconductor layer 85 become the ground potential GND of the shift part reference potential line 73. The p-type semiconductor layer 83 and the n-type semiconductor layer 85 are laminated via the tunnel junction layer 84. Accordingly, the p-type semiconductor layer 83 and the n-type semiconductor layer 85 are at the same potential.

Light Emission Pulse Waveform of Light-Emitting Device 10'

Waveforms (hereinafter, denoted as light emission pulse waveforms) of light emission pulses by the light-emitting device 10' and a light-emitting device (not shown) using a light-emitting array with no shift part 120 will be described. As shown in FIG. 8, the light-emitting device 10' includes the light-emitting array 100' including the shift part 120. Then, in the light-emitting array 100', as described above, the shift part reference potential line 73 is set to the ground potential GND (0 V). On the other hand, the light-emitting device using the light-emitting array with no shift part 120 includes the light-emitting array including only the light emission control thyristor S and the VCSEL connected in series in FIG. 5 (or FIG. 8), and the light emission control thyristor S connected to the VCSEL is controlled by a signal from the outside.

Figures 10A, 10B, 10C:
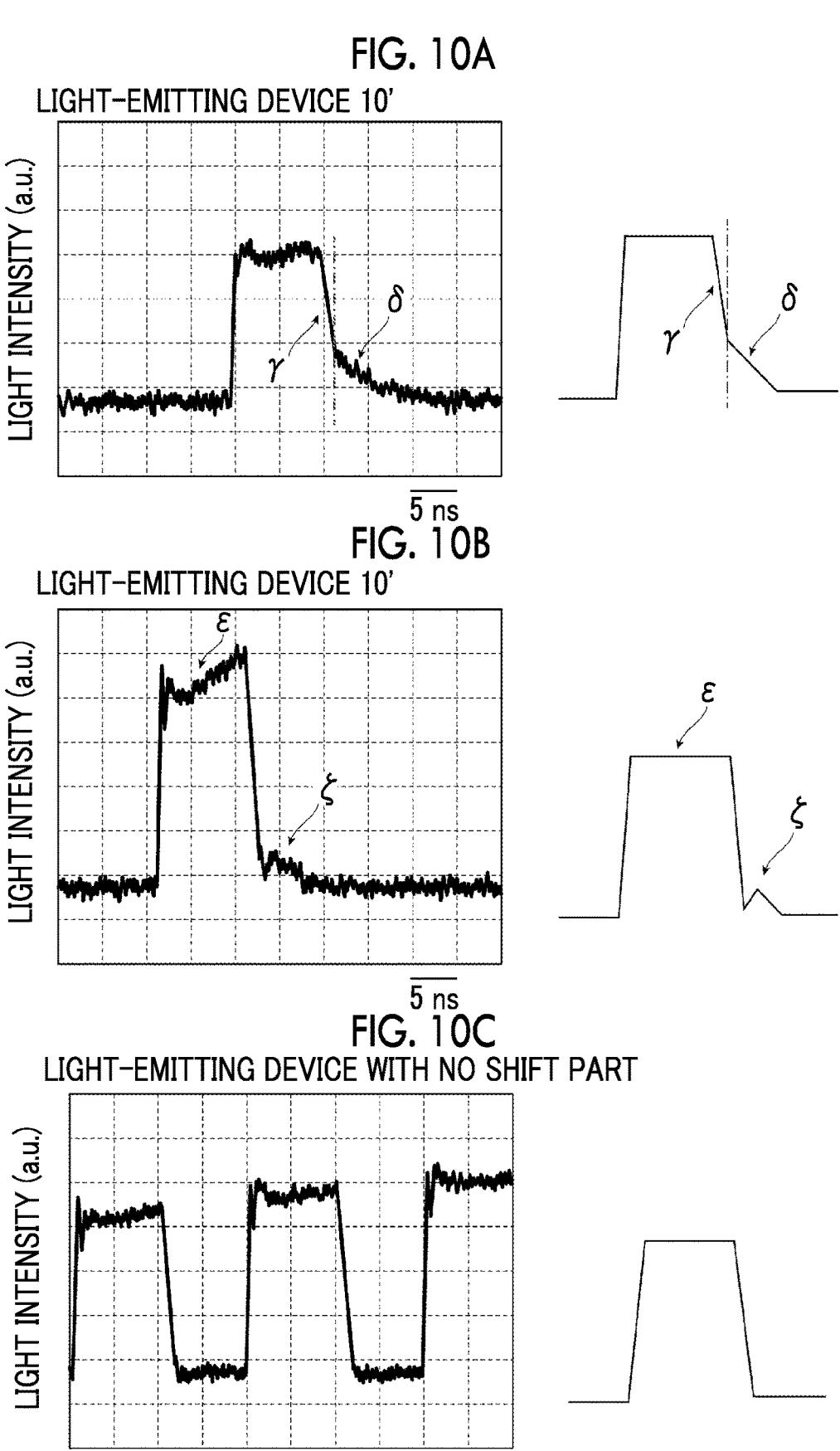
FIGS. 10A to 10C are diagrams showing a light emission pulse waveform, and specifically.

FIGS. 10A to 10C are diagrams showing the light emission pulse waveform. FIGS. 10A and 10B show the light emission pulse waveform by the light-emitting device 10' using the light-emitting array 100' of the comparative example, and FIG. 10C shows the light emission pulse waveform by the light-emitting device (not shown) using the light-emitting array with no shift part. In FIGS. 10A, 10B, and 10C, the light emission pulse waveform is indicated on the left side, and a schematic view of the light emission pulse waveform is indicated on the right side. In the light emission pulse waveform indicated on the left side, the horizontal axis is time with one scale of 5 ns, and the vertical axis is light intensity (a.u.).

In the light-emitting device using the light-emitting array with no shift part shown in FIG. 10C, as shown in the schematic view on the right side, the light emission pulse waveform has a constant inclination in a rise and a fall.

In contrast, in the light emission pulse waveform shown in FIG. 10A, as shown in the schematic view on the right side, an inclination in a fall is changing. That is, the fall has two portions with different inclinations, and has, following a portion indicated by an arrow γ (the portion of the arrow γ), a portion indicated by an arrow δ (the portion of the arrow δ) having a more gradual inclination than the portion of the arrow γ. Here, the portion indicated by the arrow δ is called a shoulder. In a case where the shoulder is provided in the falling portion of the light emission pulse waveform, a falling time is extended, compared to a case (a case of FIG. 10C) where no shoulder is provided.

The light emission pulse waveform shown in FIG. 10B has, in addition to a first peak indicated by an arrow c (the peak of the arrow c), a second peak indicated by an arrow (the peak of the arrow) in a falling portion of the first peak as shown in the schematic view on the right side. That is, in a case where the second peak (the peak of the arrow) is provided in the falling portion of the light emission pulse waveform, a falling time is extended, compared to a case (a case of FIG. 10C) where the second peak is not provided.

Next, in the light-emitting device 10' having the shift part 120, a reason for which the shoulder or the second peak is provided in the falling portion of the light emission pulse waveform in a case where the shift part reference potential line 73 is set to the ground potential GND (0 V) that is the reference potential will be described.

Figures 11A, 11B:
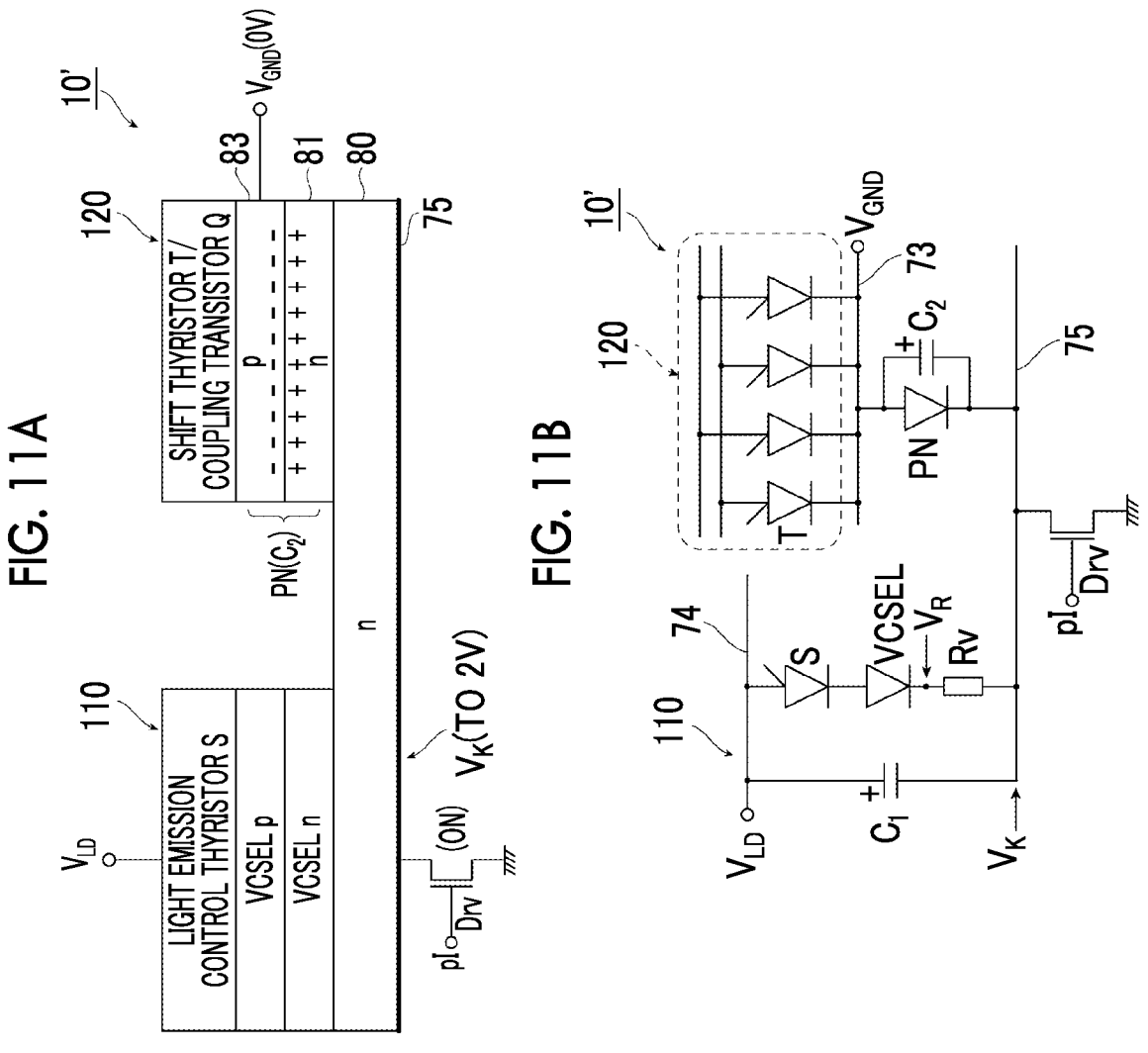
FIGS. 11A and 11B are an enlarged cross-sectional view of the light-emitting array of the comparative example and an equivalent circuit of a portion shown in the enlarged cross-sectional view, and specifically.

FIGS. 11A and 11B are an enlarged cross-sectional view of the light-emitting array 100' of the comparative example and an equivalent circuit of a portion shown in the enlarged cross-sectional view. FIG. 11A is an enlarged cross-sectional view, and FIG. 11B is an equivalent circuit of a portion shown in the enlarged cross-sectional view. In FIG. 11A, to indicate a relationship of a pn junction, the n-type semiconductor substrate 80 is denoted as n and in the light-emitting part 110, the n-type semiconductor layer 81 in the VCSEL is denoted as VCSEL n and the p-type semiconductor layer

83 in the VCSEL is denoted as VCSEL p, and the light emission control thyristor S is configured on the VCSEL. The active layer 82 and the tunnel junction layer 84 are omitted. In the shift part 120, the n-type semiconductor layer 81 is denoted as n and the p-type semiconductor layer 83 is denoted as p, and the shift thyristor T and the coupling transistor Q are configured on the p-type semiconductor layer 83. The active layer 82 and the tunnel junction layer 84 are omitted.

As described referring to FIGS. 7A and 7B, the shift part reference potential line 73 is the n-type semiconductor layer 85. The n-type semiconductor layer 85 is provided on the p-type semiconductor layer 83 with the tunnel junction layer 84 interposed therebetween. The tunnel junction layer 84 is provided such that a reverse bias does not occur between the n-type semiconductor layer 85 and the p-type semiconductor layer 83. Accordingly, the n-type semiconductor layer 85 and the p-type semiconductor layer 83 are at the same potential. Therefore, in FIG. 11A, the $V_{GND}$ terminal is denoted as being connected to the p-type semiconductor layer 83. That is, the shift part reference potential line 73 may be the n-type semiconductor layer 85 or may be the p-type semiconductor layer 83. The shift part reference potential line 73 may be a semiconductor layer laminate of the p-type semiconductor layer 83 and the n-type semiconductor layer 85.

Then, the drain of the NMOS transistor in the driver Drv is connected to the substrate electrode 75 ($V_K$ terminal) provided on the rear surface of the n-type semiconductor substrate 80. The source of the NMOS transistor is set to the ground potential GND (0 V). The potential of the substrate electrode 75 is the substrate potential $V_K$.

In a case where the driver Drv is on, a current flows from the $V_{LD}$ terminal at the light emission potential $V_{LD}$ (7 V) toward the driver Drv via the light emission control thyristor S and the VCSEL. In this case, the substrate potential $V_K$ becomes, for example, about 2 V (denoted as ~2 V) by internal resistance (resistor Rv shown in FIG. 11(b)) in the light-emitting part 110.

The n-type semiconductor layer 81 is provided on the n-type semiconductor substrate 80, and is at the same potential as the n-type semiconductor substrate 80. The substrate electrode 75 provided on the rear surface of the n-type semiconductor substrate 80 is at the substrate potential $V_K$. Accordingly, the n-type semiconductor layer 81 also becomes the substrate potential $V_K$. On the other hand, the p-type semiconductor layer 83 is at the ground potential GND (0 V). For this reason, a reverse bias occurs in the PN junction between the n-type semiconductor layer 81 (~2 V) and the p-type semiconductor layer 83 (0 V) in the shift part 120. As a result, the PN junction configures capacitance $C_2$ and accumulates electric charge. That is, a difference voltage between the ground potential GND and the substrate potential $V_K$ is applied to the capacitance $C_2$ by the PN junction between the n-type semiconductor layer 81 and the p-type semiconductor layer 83. In other words, in a case where the VCSEL is subjected to low-side drive, a reverse bias occurs in the PN junction.

In the equivalent circuit shown in FIG. 11B, the light-emitting part 110 is represented by parallel connection of the VCSEL, the light emission control thyristor S, and the internal resistance Rv connected in series and the capacitance $C_1$. As shown in FIG. 5, the light-emitting part 110 has a configuration in which a plurality of series circuits having the VCSEL and the light emission control thyristor S connected in series are connected in parallel. Accordingly, series connection of the VCSEL other than (series connection of the light emission control thyristor S and) the VCSEL to be lighted and the light emission control thyristor S becomes the capacitance $C_1$ connected in parallel to (series connection of the light emission control thyristor S and) the VCSEL to be made to emit light. The internal resistance Rv is resistance with respect to a current flowing in the VCSEL and the light emission control thyristor S connected in series. The internal resistance Rv is resistance included inside the VCSEL and the light emission control thyristor S, and is not a resistor provided externally. For example, the internal resistance Rv increases as the current passing portion α of the VCSEL is reduced (narrowed). In the fractionated irradiation, in a case where the number of light-emitting blocks 111 increases and the number of VCSELs to be made to emit light simultaneously decreases, the internal resistance Rv increases (see FIG. 3). In FIG. 11B, a potential of a connection point of the VCSEL and the internal resistance Rv is referred to as an internal potential $V_R$.

In the shift part 120 shown in FIG. 11B, for simplification of denotation, only the shift thyristor T is shown. The shift part 120 has no relation with the light emission pulse waveform. Hereinafter, the shift part 120 will be omitted.

As shown in FIG. 11A, the PN junction is configured in a lower portion of the shift part 120. Accordingly, in the light-emitting array 100', in a case where an occupation area of the shift part 120 increases, the capacitance $C_2$ configured by the PN junction increases. As will be understood from the plan view of the light-emitting array 100 shown in FIG. 3 as an example, the occupation area of the shift part 120 is not always smaller than the light-emitting part 110. That is, the capacitance $C_2$ of the shift part 120 is not always smaller than the capacitance $C_1$ of the light-emitting part 110, and has an influence on the light emission pulse waveform. For example, the capacitance $C_2$ is 200 pF.

Next, the influence of the capacitance $C_2$ configured by the PN junction on the light emission pulse waveform will be described.

A part (a) in FIG. 12 to a part (d) in FIG. 12 is a diagram illustrating the influence of the capacitance $C_2$ configured by the PN junction on the light emission pulse waveform in the light-emitting device 10' of the comparative example. A part (a) in FIG. 12 is a case where the driver Dry is on, a part (b) in FIG. 12 is a case where the driver Drv is shifted from on to off, a part (c) in FIG. 12 is a case where the driver Drv is off, and a part (d) in FIG. 12 is a case where the driver Dry is shifted from off to on. Here, the light emission potential $V_{LD}$ is 7 V. Then, the shift part reference potential line 73 is connected to the $V_{GND}$ terminal at the ground potential GND (0 V). In a part (a) in FIG. 12, a part (b) in FIG. 12, a part (c) in FIG. 12, and a part (d) in FIG. 12, the on state of the driver Drv is denoted as ON, and the off state of the driver Drv is denoted as OFF. The same applies hereinafter. A path of a light emission current is indicated by a broken line.

In a part (a) in FIG. 12, in a case where the driver Drv is on, the light emission control thyristor S is in the on state, and the VCSEL emits light. That is, a current flows from the $V_{LD}$ terminal to which the light emission potential $V_{LD}$ (7 V) is supplied, toward GND by way of the light emission control thyristor S, the VCSEL, the internal resistance Rv, and the driver Drv, and the VCSEL emits light. In a case where the forward voltage Vd is 1.5 V, a voltage that is applied to the light emission control thyristor S in the on state becomes 1.5 V, and a voltage that is applied to the VCSEL that emits light becomes 1.5 V. Accordingly, the internal potential $V_R$ becomes 4 V. That is, 3 V is applied to series connection of the light emission control thyristor S and the VCSEL. In this case, the substrate potential $V_K$ is 2 V. Accordingly, 2 V is applied to the internal resistance resistor Rv.

As shown in a part (b) in FIG. 12, in a case where the driver Drv is shifted from on to off, the current flowing in the light emission control thyristor S, the VCSEL, and the internal resistance Rv connected in series falls by a time constant $(C_1+C_2) \times Rv$ that is determined by parallel capacitance of the capacitance $C_1$ and the capacitance $C_2$ and the internal resistance Rv. Then, the substrate potential substrate potential $V_K$ increases from 2 V toward 4 V. In a period during which the substrate potential $V_K$ increases from 2 V toward 4 V, since 3 V is applied to series connection of the light emission control thyristor S and the VCSEL, the light emission control thyristor S is in the on state, and the VCSEL continues to emit light.

As shown in a part (c) in FIG. 12, when the driver Drv is off, in a case where the substrate potential $V_K$ becomes 4 V, the light emission control thyristor S is shifted from the on state to the off state, and the VCSEL is quenched. Then, the change of the substrate potential $V_K$ is stopped. In this case, the internal potential $V_R$ becomes 4 V that is the same as the substrate potential $V_K$.

As shown in a part (d) in FIG. 12, in a case where the driver Drv is shifted from off to on, the light emission current rises by a time constant that is determined by the parallel capacitance of the capacitance $C_1$ and the capacitance $C_2$ and on resistance of the driver Drv. The on resistance of the driver Drv is smaller than the internal resistance Rv. Accordingly, the light emission current rises in a shorter time than the fall (rises rapidly). Then, a shift is made to the state of a part (a) in FIG. 12.

As described above, in the light-emitting device 10', in a case where the shift part reference potential line 73 is set to the ground potential GND (0 V), and in a case where the driver Drv is shifted from on to off, the light emission current falls by the time constant $(C_1+C_2) \times Rv$ that is determined by the parallel capacitance of the capacitance $C_1$ and the capacitance $C_2$ and the internal resistance Rv. As described above, the capacitance $C_2$ is not always smaller than the capacitance $C_1$. That is, since the light emission current flows in a state (denoted as a parallel connection state) in which the capacitance $C_1$ and the capacitance $C_2$ are connected in parallel, the shoulder or the second peak occurs in the fall, and a falling characteristic is deteriorated.

In addition, the influence of the capacitance $C_2$ configured by the PN junction on the light emission pulse waveform will be described by a simulation.

FIGS. 13A and 13B are circuit models that are used in a simulation for evaluating the influence of the capacitance $C_2$ configured by the PN junction. FIG. 13A is a circuit model of the light-emitting device 10' of the comparative example, and FIG. 13B is a circuit model of the light-emitting device (light-emitting device with no shift part) using the light-emitting array with no shift part 120. Here, the light emission control thyristor S is omitted. In FIG. 13A, parasitic inductance L1 in connection of the light-emitting array 100' (a portion indicated by the VCSEL, the capacitance $C_1$ and $C_2$, the PN junction in FIG. 13A) and the power supply VS2 that supplies the light emission potential $V_{LD}$, parasitic inductance L2 in connection of the light-emitting array 100' and the driver Drv, and parasitic inductance L3 in connection of the PN junction and the capacitance $C_2$, and the ground potential GND are present. An influence of resistance in such connection is small. In FIG. 13B, since the shift part 120 is not provided, the PN junction, the capacitance $C_2$, and the parasitic inductance L3 are not present. In FIGS. 13A and 13B, the ground potential GND is indicated by an inverted triangle.

FIGS. 14A and 14B are light emission pulse waveforms obtained by a simulation. FIG. 14A is a case of the light-emitting device 10' of the comparative example of FIG. 13A, and FIG. 14B is a case of the light-emitting device (light-emitting device with no shift part) using the light-emitting array with no shift part 120 of FIG. 13B. In FIGS. 14A and 14B, the horizontal axis is time, and the vertical axis is light intensity (a.u.).

In the light-emitting device (light-emitting device with no shift part) using the light-emitting array with no shift part 120 shown in FIG. 14B, the light emission pulse waveform has a constant inclination in a rise and a fall, and this is the same as in the case shown in FIG. 10C. On the other hand, in the light-emitting device 10' using the light-emitting array 100' with the shift part 120 shown in FIG. 14A, the light emission pulse waveform is more gradual in a rise and a fall than in FIG. 14B, and light intensity vibrates. This is due to the influence of the PN junction (capacitance $C_2$) and the parasitic inductance L3.

Accordingly, in the light-emitting device 10 to which the present exemplary embodiment is applied, as shown in FIG. 5, the disconnection part 130 is provided, such that the influence of the PN junction (capacitance $C_2$) on the light emission pulse waveform is suppressed.

A part (a) in FIG. 15 to a part (d) in FIG. 15 is a diagram illustrating the operation of the light-emitting device 10 to which the present exemplary embodiment is applied. A part (a) in FIG. 15 is a case where the driver Drv is on, a part (b) in FIG. 15 is a case where the driver Drv is shifted from on to off, a part (c) in FIG. 15 is a case where the driver Drv is off, and a part (d) in FIG. 15 is a case where the driver Drv is shifted from off to on. Here, the light emission potential $V_{LD}$ is 7 V. A path of the light emission current is indicated by a broken line. Then, the disconnection part 130 is indicated by a switch. The disconnection part 130 has one end connected to the $V_{GND}$ terminal to which the ground potential GND as the reference potential is supplied, and the other end connected to the anode A of the PN junction (capacitance $C_2$). Other configurations are the same as the configurations in a part (a) in FIG. 12 to a part (d) in FIG. 12 and are thus represented by the same reference numerals, and description thereof will not be repeated.

It is assumed that a case shown in a part (a) in FIG. 15 where the driver Drv is on is immediately after the shift part 120 is operated to select the VCSEL desired to be made to emit light. In operating the shift part 120 to select the VCSEL desired to be made to emit light, as described above, the shift part reference potential line 73 needs to be set to the ground potential GND (0 V). Accordingly, immediately after the shift part 120 is operated to select the VCSEL desired to be made to emit light, the switch of the disconnection part 130 is on, and the shift part reference potential line 73 is at the ground potential GND (0 V). In this state, the driver Drv is on. This state is the same as in a part (a) in FIG. 12, and the light emission current flows from the $V_{LD}$ terminal to which the light emission potential $V_{LD}$ (7 V) is supplied, by way of the light emission control thyristor S, the VCSEL, the internal resistance Rv, and the driver Drv.

As shown in a part (b) in FIG. 15, in a case where the driver Drv is shifted from on to off, the switch of the disconnection part 130 is off, and the connection of the shift part reference potential line 73 and the ground potential GND is disconnected. Then, the shift part reference potential line 73 enters a floating state from the ground potential GND (0 V). Here, a potential in the floating state is denoted as a floating potential (Hi-Z). That is, the shift part reference potential line 73 becomes the floating potential (Hi-Z) from the ground potential GND (0 V). With this, the light emission current flowing in the light emission control thyristor S, the VCSEL, and the internal resistance Rv is prevented from flowing in the capacitance $C_2$, and flows toward the capacitance $C_1$. That is, the light emission current falls by a time constant $C_1 \times Rv$ that is determined by the capacitance $C_1$ and the internal resistance Rv. The time constant is smaller than the time constant $(C_1+C_2) \times Rv$ in a case where the shift part reference potential line 73 is set to the ground potential GND (0 V), shown in a part (b) in FIG. 12. Accordingly, in a case where the shift part reference potential line 73 is disconnected from the ground potential GND (0 V), the time of the fall of the light emission pulse is reduced (the fall is quickened), compared to a case where the shift part reference potential line 73 is set to the ground potential GND (0 V). Disconnection by the disconnection part 130 refers to disconnecting the connection on an electric circuit of the shift part 120 of the light-emitting array 100 and the reference part 252 of the control unit 250. That is, in a case where the switch of the disconnection part 130 is shifted from on to off, the ground potential GND that is supplied from the reference part 252 is not supplied to the shift part 120.

Here, although a timing at which the switch of the disconnection part 130 is turned off is a time of shifting the driver Drv from on to off, any timing may be made as long as the timing is after the driver Drv is shifted from off to on. As described below, the timing at which the switch of the disconnection part 130 is turned off may be immediately after the VCSEL starts to emit light.

As shown in a part (c) in FIG. 15, when the driver Drv is off, in a case where the substrate potential $V_K$ becomes 4 V, the light emission control thyristor S is shifted from the on state to the off state, and the VCSEL is quenched. This state is the same as in a part (c) in FIG. 12, but the shift part reference potential line 73 is maintained at the floating potential (Hi-Z).

As shown in a part (d) in FIG. 15, the driver Drv is shifted from off to on. In this case, the shift part reference potential line 73 is maintained at the floating potential (Hi-Z). Then, the light emission current rises by a time constant that is determined by the capacitance $C_1$ and the on resistance of the driver Drv. The on resistance of the driver Drv is smaller than the internal resistance Rv. Accordingly, the light emission current rises more quickly than the fall. Thereafter, in a case where the driver Drv is shifted from on to off, return is made to a part (b) in FIG. 15.

In a case where the shift part reference potential line 73 becomes the floating potential (Hi-Z), the shift part 120 does not operate. Note that the VCSEL is made to repeatedly generate the light emission pulses by the above-described memory effect (this may be denoted as continuous light emission pulses). In a case where the shift part reference potential line 73 is at the floating potential (Hi-Z), the on state of the shift thyristor T is not maintained. In this case, the light-emitting block 111 (here, the VCSEL) to be next lighted may be selected by starting the shift operation from the shift thyristor T(1) in the shift part 120 again.

In the present exemplary embodiment, the disconnection thyristor U is used as the switch of the disconnection part 130 described above (see FIG. 5).

FIG. 16 is a cross-sectional view illustrating the structure of the disconnection thyristor U in the light-emitting array 100 to which the present exemplary embodiment is applied. Here, in addition to the disconnection thyristor U, the shift thyristor T(1), and the coupling transistor Q(1) shown in FIG. 7B, the cross sections of the VCSEL(1) and the light emission control thyristor S(1) are shown in parallel. The arrangement is different from FIGS. 6 and 7B.

The disconnection thyristor U is configured with the islands 308A and 308B and the n-type semiconductor layer 85 provided on the island 300. The n-type semiconductor layer 85 is the n-gate Gn, the p-type semiconductor layer 86 of the island 308A is the anode A, the p-type semiconductor layer 86 of the island 308B is the p-gate Gp, and the n-type semiconductor layer 87 is the cathode K. Then, the p-ohmic electrode 323 provided on the p-type semiconductor layer 86 (anode A) of the island 308A is the anode A electrode. The n-ohmic electrode 340 provided on the n-type semiconductor layer 87 (cathode K) of the island 308B is the cathode K electrode. Then, the p-ohmic electrode 323 (anode A electrode) is connected to the n-type semiconductor substrate 80 through the resistor Ru. The n-ohmic electrode 340 (cathode K electrode) is connected to the reference part 252 that supplies the ground potential GND as the reference potential. It is assumed that parasitic inductance L4 is present in a line that connects the n-ohmic electrode 340 (cathode K electrode) to the reference part 252.

As shown in FIG. 16, the anode A and the p-gate Gp of the disconnection thyristor U are configured with the p-type semiconductor layer 86 similarly to the p-gate Gp of the shift thyristor T(1) or the base B of the coupling transistor Q(1) of the shift part 120 or the p-gate Gp of the light emission control thyristor S(1). The n-gate Gn of the disconnection thyristor U is configured with the n-type semiconductor layer 85 similarly to the cathode K of the shift thyristor T(1) or the emitter E of the coupling transistor Q(1) of the shift part 120 or the cathode K of the light emission control thyristor S(1). The cathode K of the disconnection thyristor U is configured with the n-type semiconductor layer 87 similarly to the n-gate Gn of the shift thyristor T(1) or the collectors Cf and Cs of the coupling transistor Q(1) of the shift part 120 or the n-gate Gn of the light emission control thyristor S(1). That is, the n-gate Gn of the disconnection thyristor U is connected to the cathode K of the shift thyristor T(1) and the emitter E of the coupling transistor Q(1) via the n-type semiconductor layer 85.

Then, the resistor Ru of the disconnection part 130 is configured with the n-type semiconductor layer 87 as described above. That is, the disconnection part 130 is configured by the semiconductor layer laminate that configures the light-emitting array 100. In this manner, the light-emitting array 100 is configured. In the disconnection part 130, the n-type semiconductor layer 85 is an example of a semiconductor layer, and the island 308A configured with the p-type semiconductor layer 86 is an example of a region of a one-layered semiconductor layer having a different polarity on the semiconductor layer, and the island 308B configured with the p-type semiconductor layer 86 and the n-type semiconductor layer 87 is an example of a two-layered semiconductor layer having a different polarity on the semiconductor layer.

FIGS. 17A and 17B are circuit models with which the operation of the disconnection part 130 to which the present exemplary embodiment is applied is simulated. FIG. 17A is a case where the driver Drv is off, and FIG. 17B shows a moment at which the driver Drv is turned on. Here, in addition to parasitic inductance L1 that occurs in a line connecting the light-emitting array 100 (a portion of the VCSEL, the capacitance $C_1$ and $C_2$, the PN junction, the disconnection thyristor U, and the resistor Ru in FIGS. 17A and 17B) and the power supply VS2 for supplying the light emission potential $V_{LD}$, and parasitic inductance L2 that occurs in a line connecting the light-emitting array 100 and the driver Drv, parasitic inductance L4 that occurs in a line connecting the disconnection part 130 and the reference part for supplying the ground potential GND is shown. In FIGS. 17A and 17B, the ground potential GND is indicated by an inverted triangle.

In FIGS. 17A and 17B, as in FIG. 9A, the disconnection thyristor U is indicated by a combination of an npn bipolar transistor Tr3 (hereinafter, denoted as an npn transistor Tr3) and a pnp bipolar transistor Tr4 (hereinafter, denoted as a pnp transistor Tr4). Then, in the npn transistor Tr3 and the pnp transistor Tr4, an emitter E, a base B, and a collector C are denoted.

An anode A of the disconnection thyristor U (the emitter E of the pnp transistor Tr4) is connected to one terminal of the resistor Ru. The other terminal of the resistor Ru is connected to the substrate potential $V_K$ (n-type semiconductor substrate 80). A cathode K of the disconnection thyristor U (the emitter E of the npn transistor Tr3) is connected to the ground potential GND via the parasitic inductance L4. An n-gate Gn of the disconnection thyristor U (the collector C of the npn transistor Tr3 and the base B of the pnp transistor Tr4) is connected to the shift part reference potential line 73. The base B of the npn transistor Tr3 and the collector C of the pnp transistor Tr4 are a p-gate Gp of the disconnection thyristor U. Here, the shift part reference potential line 73 (the n-gate Gn of the disconnection thyristor U) is set to a potential V0, the anode A of the disconnection thyristor U is set to a potential V1, and the p-gate Gp of the disconnection thyristor U is set to a potential V2.

In a case where the driver Drv is off, shown in FIG. 17A, the relationship is set such that the light emission potential $V_{LD}$>the substrate potential $V_K$>the potential V1>the potential V2>the potential V0. That is, in the disconnection thyristor U, the potential V1 of the anode A is set to be greater than the potential V0 of the n-gate Gn by the forward voltage Vd or more, and a base current flows in the pnp transistor Tr4 as indicated by an arrow, and the pnp transistor Tr4 enters an on state. Then, the potential V2 of the base B of the npn transistor Tr3 is a potential obtained by subtracting the saturation voltage Vsat from the potential V1, and is set to be greater than the potential V0 of the n-gate Gn by the forward voltage Vd or more. Accordingly, a base current flows in the npn transistor Tr3 as indicated by an arrow, and the npn transistor Tr3 enters an on state. That is, in a case where the driver Drv is off, the disconnection thyristor U is in the on state, and the potential V0 becomes the saturation voltage Vsat close to the ground potential GND. That is, the disconnection thyristor U is in the on state, whereby the shift part reference potential line 73 is set to a potential close to the ground potential GND. With this, the shift part 120 operates as described above and selects the VCSEL desired to be made to emit light.

As shown in FIG. 17B, at a moment at which the driver Drv is turned on, in the NMOS transistor of the driver Drv, with a constant current operation, a current flows from the light emission potential $V_{LD}$ by way of the VCSEL, and a drive current I (arrow) is forcibly drawn by way of the resistor Ru instantaneously. Then, the potential V1 becomes a negative voltage. At a moment at which the potential V1 becomes a negative voltage, a potential difference between the potential V1 and the potential V0 decreases, and as indicated by a white arrow, the pnp transistor Tr4 is shifted from the on state to the off state. Then, as further indicated by a white arrow, a current does not flow in the base B of the npn transistor Tr3, and the npn transistor Tr3 is also shifted from the on state to the off state (the disconnection thyristor U is shifted from the on state to the off state). Then, at a moment at which the npn transistor Tr3 enters the off state, the potential V0, that is, the shift part reference potential line 73 is shifted from the ground potential GND (0 V) to the floating state. With this, the capacitance $C_2$ apparently disappears. This state continues until the driver Drv is off. From the fact that the shift part 120 is disconnected from the reference part 252 that supplies the ground potential GND (0 V), the influence of the PN junction (capacitance $C_2$) on the light emission pulse waveform is suppressed. A specific time of the moment is not defined.

In a case where the driver Drv is turned off, the disconnection thyristor U is shifted from the off state to the on state. Accordingly, return is not made to a state just before the driver Drv is turned on (a state in which the shift part 120 is operated). That is, since return is made from a state in which the capacitance $C_2$ is not charged, a current flowing in the VCSEL is not influenced by the capacitance $C_2$. That is, the light emission pulse waveform when the driver Drv is turned off is not influenced by the capacitance $C_2$. In this manner, only in a period during which the driver Drv is on, the influence of the capacitance $C_2$ is eliminated.

As described above, the disconnection thyristor U is shifted from the on state to the off state at a moment at which the driver Drv is turned on. The off state continues until the driver Dry is turned off again. In a case where the driver Drv is turned off, the disconnection thyristor U is shifted from the off state to the on state again. That is, the disconnection thyristor U is automatically switched between the off state of the on state along with the operation of the driver Drv.

FIGS. 18A and 18B are light emission pulse waveforms obtained by a simulation. FIG. 18A is a case of the light-emitting device 10 to which the present exemplary embodiment is applied, and FIG. 18B is a case of the light-emitting device using the light-emitting array with no shift part 120. FIG. 18B is the same as FIG. 14B. The light emission pulse waveform shown in FIG. 18A is obtained by the circuit models of FIGS. 17A and 17B.

The light emission pulse waveform of the light-emitting device 10 shown in FIG. 18A is substantially the same as the light emission pulse waveform of the light-emitting device using the light-emitting array with no shift part 120 shown in FIG. 18B. That is, with the use of the light-emitting array 100 in which the disconnection part 130 including the disconnection thyristor U is provided, the influence of the PN junction (capacitance $C_2$) on the light emission pulse waveform is suppressed.

As a method of controlling the potential of the shift part reference potential line 73, a configuration in which a switch is provided in the reference part 252, the shift part reference potential line 73 in a case of operating the shift part 120 is set to the ground potential GND, and the shift part reference potential line 73 is set in the floating state when the VCSEL emits light is considered. In this case, the switch is controlled by a signal. In contrast, in the light-emitting array 100 to which the present exemplary embodiment is applied, the disconnection thyristor U of the disconnection part 130 is shifted from the on state to the off state in a case where the driver Drv is turned on and the light emission current flows (specifically, at a moment at which the light emission current starts to flow). That is, the disconnection thyristor U operates by itself along with the operation of the driver Drv. In other words, a signal for shifting the disconnection thyristor U from the on state to the off state is not needed. Accordingly, complication of the control unit 250 (see FIG. 5) or the measurement control unit 2 (see FIG. 1) is suppressed.

Method for Manufacturing Light-Emitting Array 100

FIGS. 19A to 19C and 19D to 19F are process views illustrating a method for manufacturing the light-emitting array 100. FIG. 19A is a semiconductor layer laminate forming step, FIG. 19B is a separation and current blocking portion forming step, FIG. 19C is a separation step in the shift part and the disconnection part, FIG. 19D is an n-type semiconductor layer exposure step, FIG. 19E is a coupling transistor and disconnection thyristor forming step, and FIG. 19F is an n-ohmic electrode, p-ohmic electrode, and substrate electrode forming step. Here, the VCSEL and the light emission control thyristor S are shown on the right side of the paper plane, and the disconnection thyristor U, the power supply line resistor Rg, the coupling resistor Re, the shift thyristor T, and the coupling transistor Q are shown from the left side toward the right side of the paper plane. Description will be provided in the following order. The arrangement is different from FIGS. 6 and 7B.

In the semiconductor layer laminate forming step shown in FIG. 19A, the n-type semiconductor layer 81, the active layer 82, and the p-type semiconductor layer 83 are laminated on the n-type semiconductor substrate 80, next, the tunnel junction layer 84 is laminated, and in addition, the n-type semiconductor layer 85, the p-type semiconductor layer 86, the n-type semiconductor layer 87, and the p-type semiconductor layer 88 are laminated. As described above, the VCSEL is configured by the n-type semiconductor layer 81, the active layer 82, and the p-type semiconductor layer 83. Accordingly, the n-type semiconductor layer 81, the active layer 82, and the p-type semiconductor layer 83 are an example of a first semiconductor layer laminate in which a light-emitting element is configured, and a step of laminating the n-type semiconductor layer 81, the active layer 82, and the p-type semiconductor layer 83 is an example of a step of laminating the first semiconductor layer laminate. The light emission control thyristor S and the shift thyristor T are configured by the n-type semiconductor layer 85, the p-type semiconductor layer 86, the n-type semiconductor layer 87, and the p-type semiconductor layer 88. Accordingly, the n-type semiconductor layer 85, the p-type semiconductor layer 86, the n-type semiconductor layer 87, and the p-type semiconductor layer 88 are an example of a second semiconductor layer laminate in which a thyristor is configured, and a step of laminating the n-type semiconductor layer 85, the p-type semiconductor layer 86, the n-type semiconductor layer 87, and the p-type semiconductor layer 88 is an example of a step of laminating the second semiconductor layer laminate. It is assumed that the tunnel junction layer 84 is included in any of the first semiconductor layer laminate or the second semiconductor layer laminate.

In the separation and current blocking portion forming step shown in FIG. 19B, the first semiconductor layer laminate and the second semiconductor layer laminate are etched to reach the n-type semiconductor substrate 80, and are separated into the island 301 in which the light-emitting part 110 is configured and the island 300 in which shift part 120 and the disconnection part 130 are configured. Then, the semiconductor layers in a plurality of semiconductor layers that configure the p-type semiconductor layer 83 are oxidized from the side surface of the exposed p-type semiconductor layer 83 to form the current blocking portion β. In the separation and current blocking portion forming step, the separation step is an example of a step of processing the second semiconductor layer laminate and the first semiconductor layer laminate to separate the light-emitting block including the light-emitting element and the disconnection part that disconnects connection of the selection part, which selects the light-emitting block to be made to emit light, and the reference part, which is provided on the outside and supplies a reference potential.

In the separation step in the shift part and the disconnection part shown in FIG. 19C, the island 302 in which the shift thyristor T and the coupling transistor Q are configured, the island 304 in which the power supply line resistor Rg and the coupling resistor Re are configured, and the island 308 (islands 308A and 308B) in which the disconnection thyristor U is configured are formed.

In the n-type semiconductor layer exposure step shown in FIG. 19D, a part of the uppermost p-type semiconductor layer 88 in the islands 301 and 302 is removed by etching to expose the n-type semiconductor layer 87. In the islands 304, 308A, and 308B, the uppermost p-type semiconductor layer 88 is removed by etching. The separation step in the shift part and the disconnection part and the n-type semiconductor layer exposure step are example of a step of processing the second semiconductor layer laminate to form the first thyristor that is included in the disconnection part and the second thyristor that is included in the selection part.

In the coupling transistor and disconnection thyristor forming step shown in FIG. 19E, in the island 302, a part of the n-type semiconductor layer 87 is removed by etching to expose the front surface of the p-type semiconductor layer 86. In the island 308A, the n-type semiconductor layer 87 is removed by etching.

In the n-ohmic electrode, p-ohmic electrode, and substrate electrode forming step shown in FIG. 19F, p-ohmic electrode 321 is formed on the p-type semiconductor layer 88 of the island 301, the p-ohmic electrode 322 is formed on the p-type semiconductor layer 88 of the island 302, the n-ohmic electrode 331 is formed on the n-type semiconductor layer 87 of the island 301, the n-ohmic electrode 332 is formed on the n-type semiconductor layer 87 of the island 302, the n-ohmic electrodes 335, 336, 337 are formed on the n-type semiconductor layer 87 of the island 304, the p-ohmic electrode 323 is formed on the p-type semiconductor layer 86 of the island 308A, and the n-ohmic electrode 340 is formed on the n-type semiconductor layer 87 of the island 308B. The substrate electrode 75 is formed on the rear surface of the n-type semiconductor substrate 80.

Thereafter, an insulating layer (insulating film) is formed on the front surface, through-holes are formed in the insulating layer (insulating film) on the n-ohmic electrode and the p-ohmic electrode described above, and the wiring lines (power supply line 71, shift signal line 72-1 and 72-2, light emission potential line 74, and the like) are formed. In this manner, the light-emitting array 100 is manufactured.

The island 303 in which the current-limiting resistor RL is configured, the island 305 in which the start resistor Rs and the power supply line resistor Rg, and the island 309 in which the resistor Ru of the disconnection part 130 is configured are formed similarly to the island 304.

In the separation and current blocking portion forming step shown in FIG. 19B described above, although the first semiconductor layer laminate and the second semiconductor layer laminate are etched to reach the n-type semiconductor substrate 80, the first semiconductor layer laminate and the second semiconductor layer laminate may be etched to reach the n-type semiconductor layer 81 of the first semiconductor layer laminate.

In the above description, a case where the light-emitting block 111 is configured with one light-emitting element (one VCSEL and one light emission control thyristor S connected in series) has been described. In a case where the light-emitting block 111 includes a plurality of light-emitting elements, an arrangement in which a plurality of series circuits of the VCSEL and the light emission control thyristor S connected in series are connected in parallel may be used. To configure the light-emitting block 111 including a plurality of VCSELs, holes (trenches) may be provided in the first semiconductor layer laminate and the second semiconductor layer laminate laminated on the semiconductor substrate to reach the semiconductor substrate, oxidation is performed from the holes such that a portion surrounded by the current blocking portion becomes the current passing portion, to form a plurality of separated VCSELs, and the second semiconductor layer laminate on the VCSELs may be used as a common light emission control thyristor (see FIG. 3).

In the exemplary embodiment of the invention, although the shift part 120 connects adjacent shift thyristors T by the coupling transistor Q, the shift part 120 may connect adjacent shift thyristors T by a diode or a resistor.

Though details are not described herein, in the shift part 120, a configuration in which a signal, such as "101011 . . . " where "1" represents the light-emitting block 111 to be made to emit light and "0" represents the light-emitting block 111 to be not made to emit light (kept quenched) is transmitted to the shift part 120, and after the light-emitting blocks 111 to be made to emit light are selected, the selected light-emitting blocks 111 are made to emit light in parallel may be used. In this manner, the multiple lighting method shown in FIG. 4B and the full lighting method shown in FIG. 4C are realized. Other than the sequential lighting method shown in FIG. 4A, the multiple lighting method shown in FIG. 4B, and the full lighting method shown in FIG. 4C, other lighting methods, such as a random lighting method in which each light-emitting block of the light-emitting part are lighted randomly.

In the present exemplary embodiment, although an example where the n-type semiconductor substrate is used has been described, a configuration in which a p-type semiconductor substrate is used may be used. In this case, the polarity may be reversed.

In the present exemplary embodiment, although the shift part 120 has been described as an example of a selection part, the light-emitting block 111 to be made to emit light may be selected by a logic circuit or the like provided on the island 300.

Although the exemplary embodiment of the invention has been described above, some of the components in the above-described exemplary embodiment may be removed or changed within a scope not changing without departing from the gist of the invention.

Supplementary Notes (((1)))
A light-emitting array comprising:
a light-emitting part having a plurality of light-emitting blocks;
a selection part that operates with a reference potential supplied from a reference part provided on an outside as a reference and selects the light-emitting block to be made to emit light; and
a disconnection part that disconnects connection of the selection part and the reference part in a period during which a light emission current caused by low-side drive is flowing in the light-emitting block.

(((2)))
The light-emitting array according to (((1))), wherein the disconnection part includes a first thyristor and a resistor, and the first thyristor transits from on to off to disconnect the connection.

(((3)))
The light-emitting array according to (((2))), wherein the selection part includes a plurality of second thyristors to which an on state is transferred, and
the second thyristors and the first thyristor have a common semiconductor layer.

(((4)))
The light-emitting array according to (((2))), wherein the first thyristor is configured with a semiconductor layer, a region of a two-layered semiconductor layer having a different polarity on the semiconductor layer, and a region of a one-layered semiconductor layer having a different polarity on the semiconductor layer.

(((5)))
The light-emitting array according to (((1))), wherein the disconnection part transits from on to off to disconnect the connection in a case where a light emission current caused by low-side drive flows in the light-emitting block.

(((6)))
A light-emitting device comprising:
the light-emitting array according to any one of (((1))) to (((5))); and
a drive unit that is turned on to make a light emission current flow in the light-emitting part of the light-emitting array by low-side drive to drive the light-emitting part of the light-emitting array.

(((7)))
A measurement apparatus comprising:
the light-emitting device according to (((6))); and
a light-receiving unit that receives light emitted from the light-emitting part of the light-emitting device and reflected by an object to be measured,
wherein the measurement apparatus measures a three-dimensional shape of the object to be measured.

(((8)))
A method for manufacturing a light-emitting array, the method comprising:
laminating a first semiconductor layer laminate in which a light-emitting element is configured, on a substrate;
laminating a second semiconductor layer laminate in which a thyristor is configured, on the first semiconductor layer laminate;
processing the second semiconductor layer laminate and the first semiconductor layer laminate to separate a light-emitting block including the light-emitting element, and a disconnection part that disconnects connection of a selection part that selects the light-emitting block to be made to emit light and a reference part that is provided on an outside and supplies a reference potential; and
processing the second semiconductor layer laminate to form a first thyristor included in the disconnection part and a second thyristor included in the selection part.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting array comprising:
a light-emitting part having a plurality of light-emitting blocks;
a selection part that comprises a plurality of shift thyristors and operates with a reference potential supplied from a reference part which is connected to the reference potential which is ground potential and is provided on an outside as a reference and selects the light-emitting block to be made to emit light; and
a disconnection part that includes a first thyristor disconnects connection of the selection part and the reference part in a period during which a light emission current caused by low-side drive is flowing in the light-emitting block.

2. The light-emitting array according to claim 1,
wherein the disconnection part further includes a resistor, and the first thyristor transits from on to off to disconnect the connection.

3. The light-emitting array according to claim 2,
wherein the selection part further includes a plurality of second thyristors to which an on state is transferred, and
the second thyristors and the first thyristor have a common semiconductor layer.

4. The light-emitting array according to claim 2,
wherein the first thyristor is configured with a semiconductor layer, a region of a two-layered semiconductor layer having a different polarity on the semiconductor layer, and a region of a one-layered semiconductor layer having a different polarity on the semiconductor layer.

5. The light-emitting array according to claim 1,
wherein the disconnection part transits from on to off to disconnect the connection in a case where a light emission current caused by low-side drive flows in the light-emitting block.

6. A light-emitting device comprising:
the light-emitting array according to claim 1; and
a drive unit that includes a transistor and is turned on to make a light emission current flow in the light-emitting part of the light-emitting array by low-side drive to drive the light-emitting part of the light-emitting array.

7. A light-emitting device comprising:
the light-emitting array according to claim 2; and
a drive unit that includes a transistor and is turned on to make a light emission current flow in the light-emitting part of the light-emitting array by low-side drive to drive the light-emitting part of the light-emitting array.

8. A light-emitting device comprising:
the light-emitting array according to claim 3; and
a drive unit that includes a transistor and is turned on to make a light emission current flow in the light-emitting part of the light-emitting array by low-side drive to drive the light-emitting part of the light-emitting array.

9. A light-emitting device comprising:
the light-emitting array according to claim 4; and
a drive unit that includes a transistor and is turned on to make a light emission current flow in the light-emitting part of the light-emitting array by low-side drive to drive the light-emitting part of the light-emitting array.

10. A light-emitting device comprising:
the light-emitting array according to claim 5; and
a drive unit that includes a transistor and is turned on to make a light emission current flow in the light-emitting part of the light-emitting array by low-side drive to drive the light-emitting part of the light-emitting array.

11. A measurement apparatus comprising:
the light-emitting device according to claim 6; and
a light-receiving unit that receives light emitted from the light-emitting part of the light-emitting device and reflected by an object to be measured,
wherein the measurement apparatus measures a three-dimensional shape of the object to be measured.

12. A measurement apparatus comprising:
the light-emitting device according to claim 7; and
a light-receiving unit that receives light emitted from the light-emitting part of the light-emitting device and reflected by an object to be measured,
wherein the measurement apparatus measures a three-dimensional shape of the object to be measured.

13. A measurement apparatus comprising:
the light-emitting device according to claim 8; and
a light-receiving unit that receives light emitted from the light-emitting part of the light-emitting device and reflected by an object to be measured,
wherein the measurement apparatus measures a three-dimensional shape of the object to be measured.

14. A measurement apparatus comprising:
the light-emitting device according to claim 9; and
a light-receiving unit that receives light emitted from the light-emitting part of the light-emitting device and reflected by an object to be measured,
wherein the measurement apparatus measures a three-dimensional shape of the object to be measured.

15. A measurement apparatus comprising:
the light-emitting device according to claim 10; and
a light-receiving unit that receives light emitted from the light-emitting part of the light-emitting device and reflected by an object to be measured,
wherein the measurement apparatus measures a three-dimensional shape of the object to be measured.

16. A method for manufacturing a light-emitting array, the method comprising:
laminating a first semiconductor layer laminate in which a light-emitting element is configured, on a substrate;
laminating a second semiconductor layer laminate in which a thyristor is configured, on the first semiconductor layer laminate;
processing the second semiconductor layer laminate and the first semiconductor layer laminate to separate a light-emitting block including the light-emitting element, and a disconnection part that disconnects connection of a selection part that comprises a plurality of shift thyristors and selects the light-emitting block to be made to emit light and a reference part that is connected to ground potential and is provided on an outside and supplies a reference potential which is the ground potential; and
processing the second semiconductor layer laminate to form a first thyristor included in the disconnection part which includes a first thyristor and a second thyristor included in the selection part.

* * * * *